(12) United States Patent
Xie et al.

(10) Patent No.: US 11,895,818 B2
(45) Date of Patent: Feb. 6, 2024

(54) STACKED FET SRAM

(71) Applicant: INTERNATIONAL BUSINESS MACHINES CORPORATION, Armonk, NY (US)

(72) Inventors: Ruilong Xie, Niskayuna, NY (US); Carl Radens, LaGrangeville, NY (US); Junli Wang, Slingerlands, NY (US); Ravikumar Ramachandran, Pleasantville, NY (US); Julien Frougier, Albany, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 17/660,640

(22) Filed: Apr. 26, 2022

(65) Prior Publication Data
US 2023/0345690 A1    Oct. 26, 2023

(51) Int. Cl.
*H10B 10/00* (2023.01)
*G11C 11/412* (2006.01)

(52) U.S. Cl.
CPC ............ *H10B 10/12* (2023.02); *G11C 11/412* (2013.01)

(58) Field of Classification Search
CPC ...... H10B 10/12; H10B 10/00; H10B 10/125; G11C 11/412
See application file for complete search history.

(56) References Cited

U.S. PATENT DOCUMENTS

| | | |
|---|---|---|
| 6,271,063 B1 | 8/2001 | Chan |
| 7,924,604 B2 | 4/2011 | Yang |
| 7,972,920 B2 | 7/2011 | Chakihara |
| 9,911,744 B2 | 3/2018 | Liaw |
| 10,192,819 B1 | 1/2019 | Chanemougame |
| 10,192,867 B1 | 1/2019 | Frougier |
| 10,510,622 B1 | 12/2019 | Frougier |
| 10,707,218 B2 | 7/2020 | Paul |
| 10,756,096 B2 | 8/2020 | Paul |

(Continued)

FOREIGN PATENT DOCUMENTS

| | | |
|---|---|---|
| EP | 1638142 A2 | 3/2006 |
| WO | 2021056682 A1 | 4/2021 |

OTHER PUBLICATIONS

Chang et al., "First Demonstration of CMOS Inverter and 6T-SRAM Based on GAA CFETs Structure for 3D-IC Applications", IEDM19-254, © 2019 IEEE, pp. 11.7.1-11.7.4.

(Continued)

*Primary Examiner* — Jerome Leboeuf
(74) *Attorney, Agent, or Firm* — Yuanmin Cai

(57) ABSTRACT

Embodiments of present invention provide a SRAM device. The SRAM device includes a first, a second, and a third SRAM cell each having a first and a second pass-gate (PG) transistor, wherein the second PG transistor of the second SRAM cell and the first PG transistor of the first SRAM cell are stacked in a first PG transistor cell, and the first PG transistor of the third SRAM cell and the second PG transistor of the first SRAM cell are stacked in a second PG transistor cell. The first and second PG transistors of the first SRAM cell may be stacked on top of, or underneath, the second PG transistor of the second SRAM cell and/or the first PG transistor of the third SRAM cell.

20 Claims, 22 Drawing Sheets

(56) References Cited

U.S. PATENT DOCUMENTS

| | | | |
|---|---|---|---|
| 2007/0007601 A1* | 1/2007 | Hsu | H10B 10/12 |
| | | | 438/238 |
| 2021/0359122 A1* | 11/2021 | Or-Bach | H10B 12/20 |
| 2021/0398977 A1* | 12/2021 | Mishra | H01L 27/092 |
| 2022/0199630 A1* | 6/2022 | Ye | H01L 21/823878 |
| 2022/0278110 A1* | 9/2022 | Liaw | H01L 27/0924 |
| 2023/0345693 A1* | 10/2023 | Wang | H01L 27/0207 |

OTHER PUBLICATIONS

Ryckaert et al., "The Complementary FET (CFET) for CMOS scaling beyond N3", 2018 Symposium on VLSI Technology Digest of Technical Papers, © 2018 IEEE, pp. 141-142.

* cited by examiner

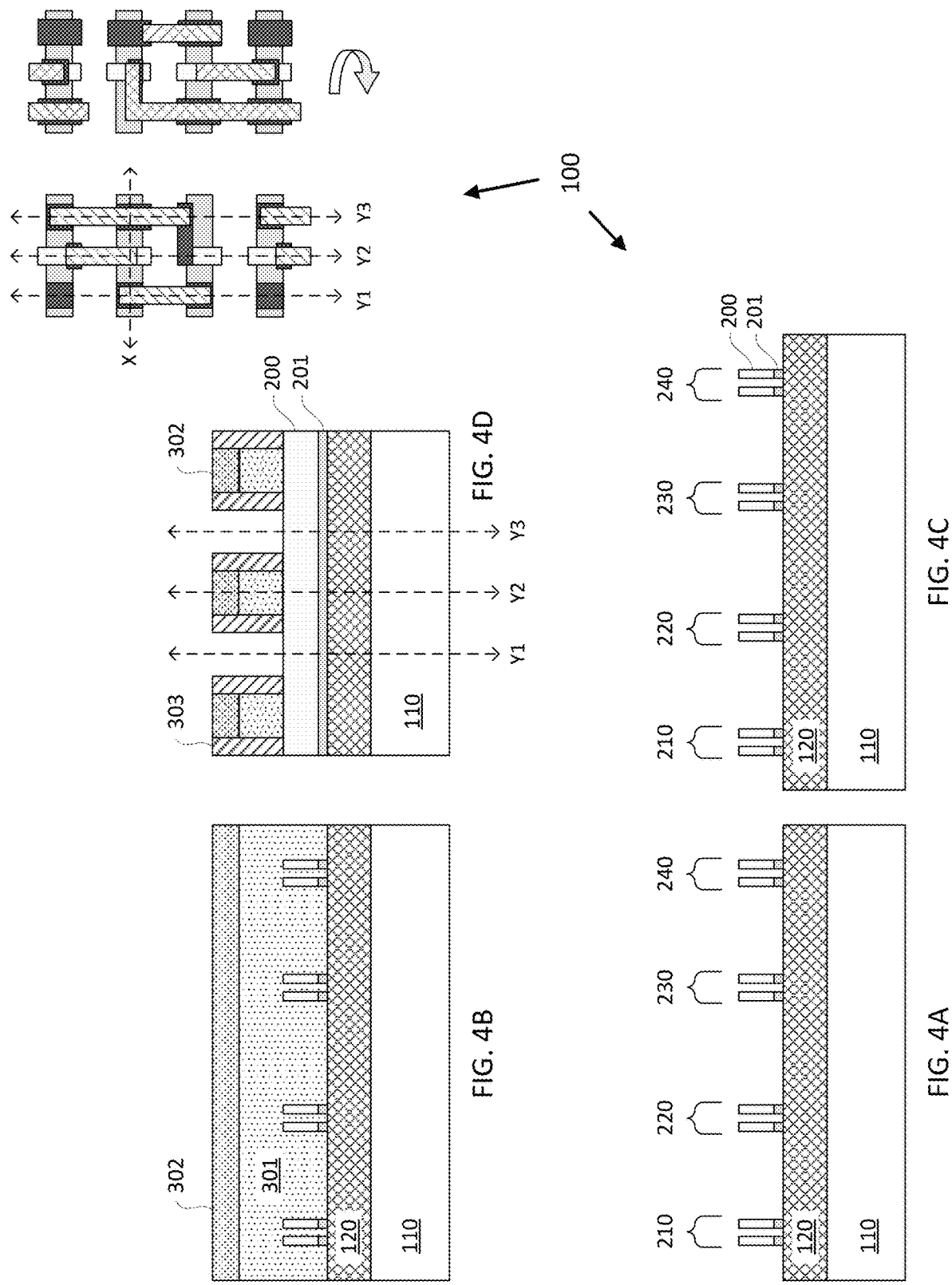

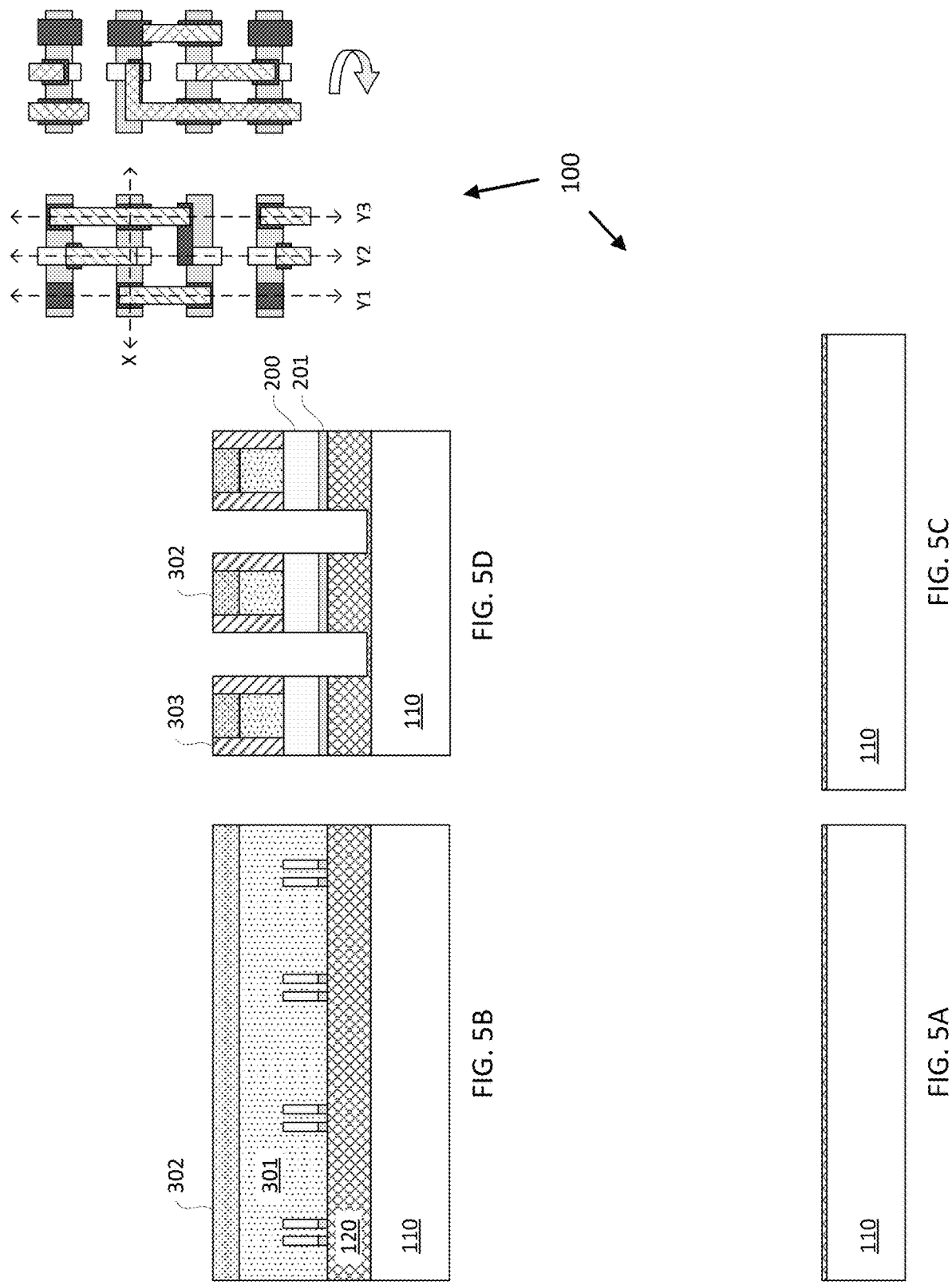

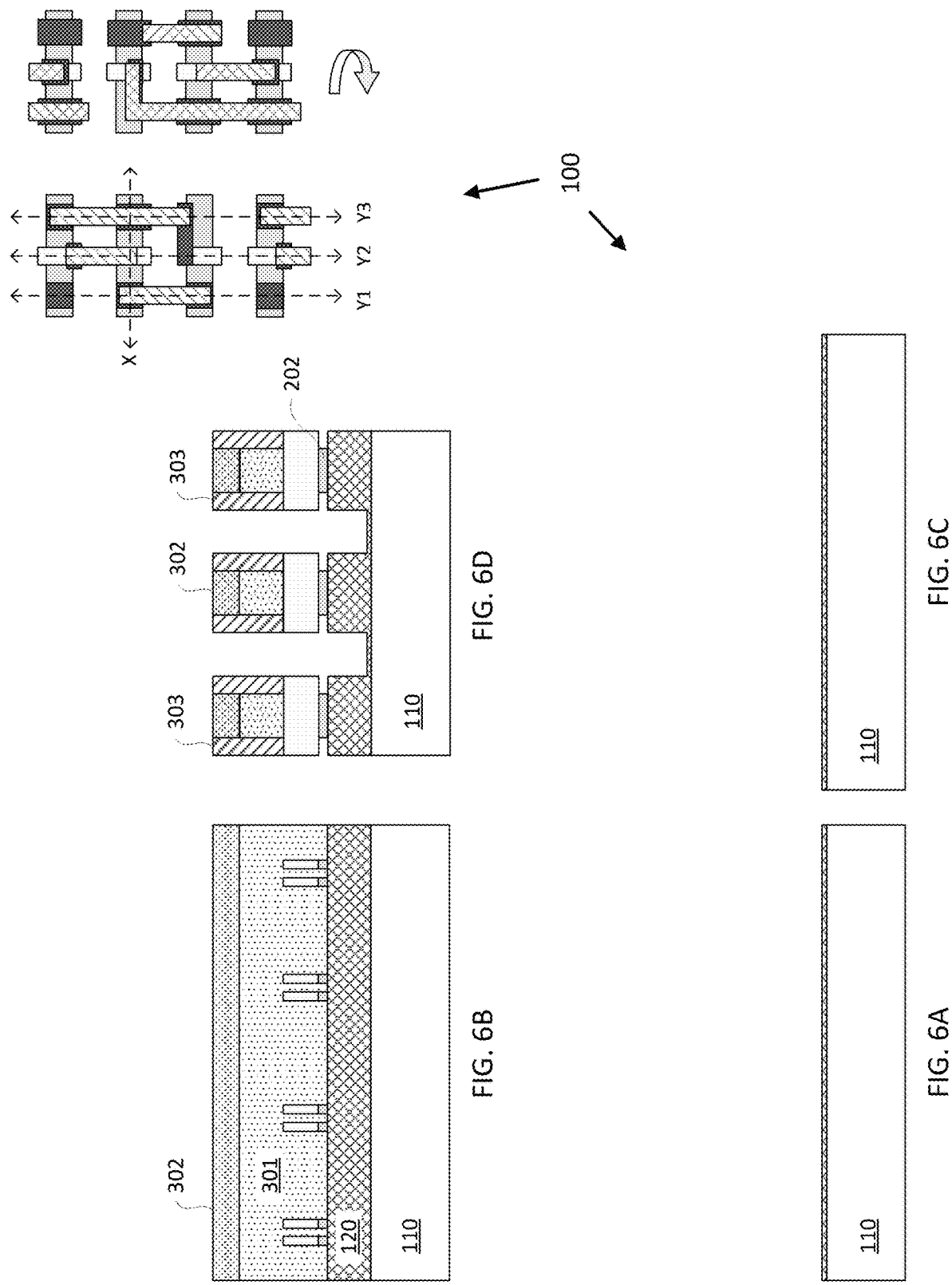

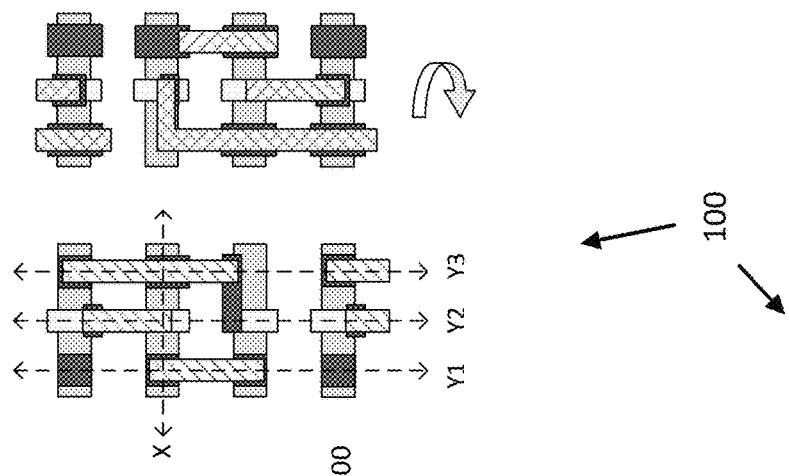
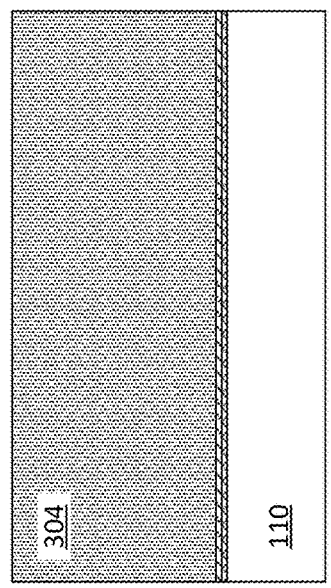
FIG. 7C
FIG. 7A
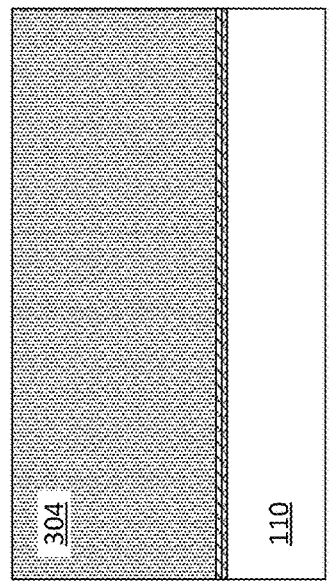
FIG. 7D
FIG. 7B

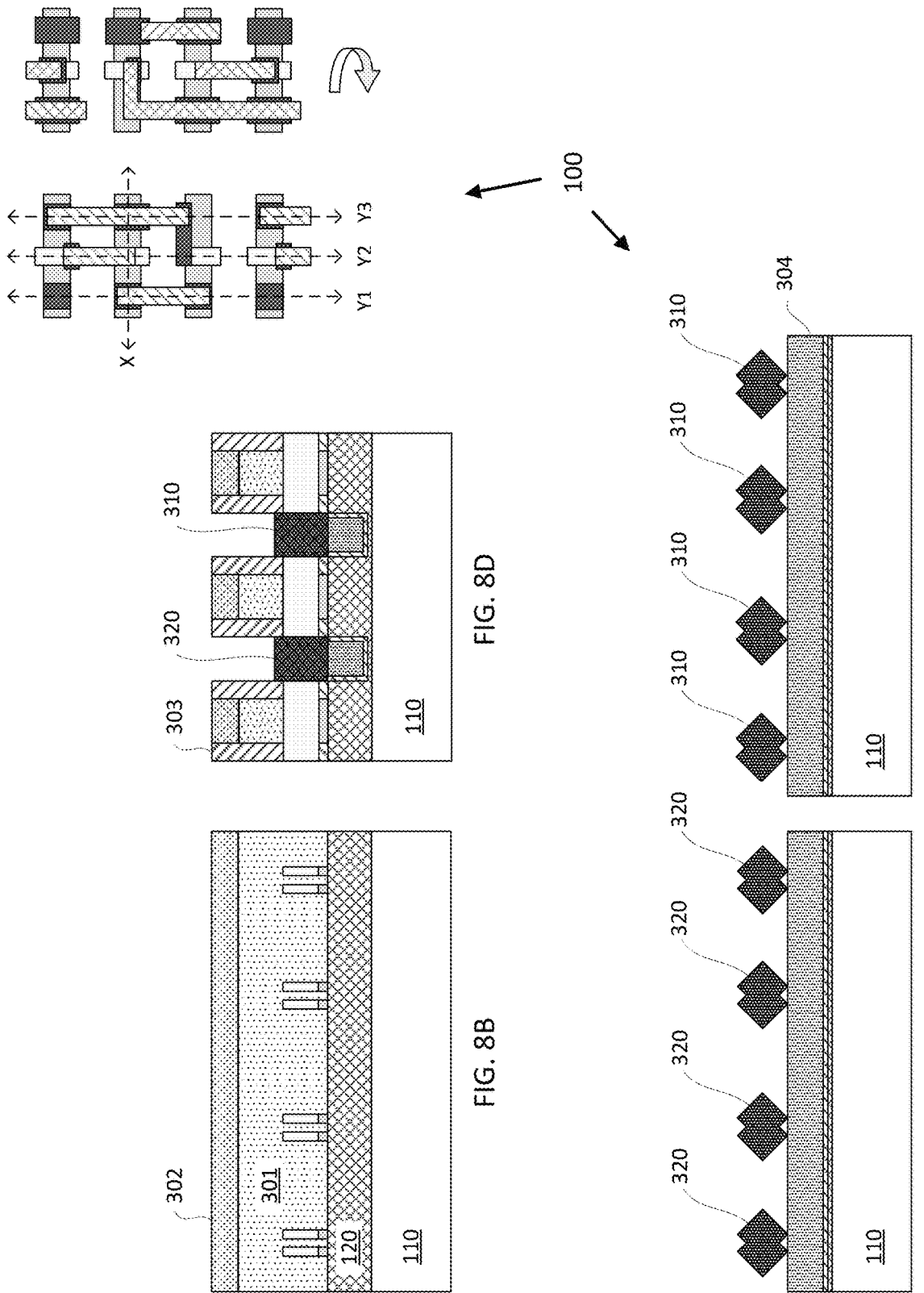

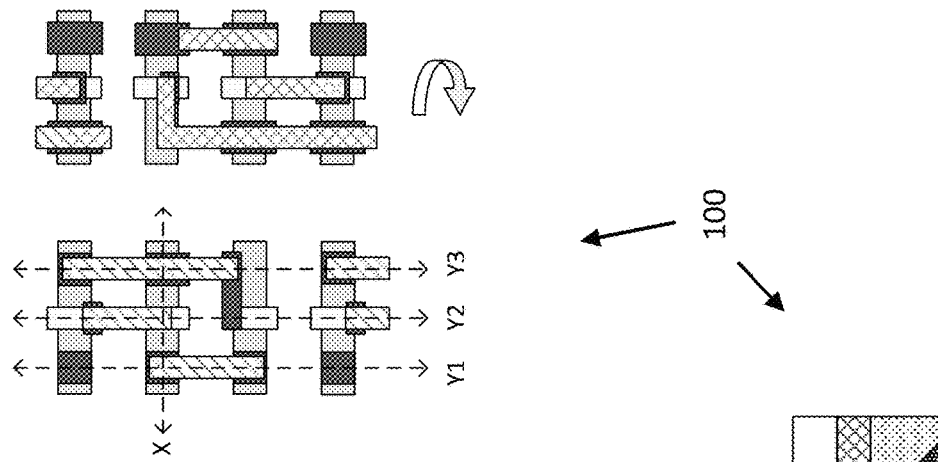
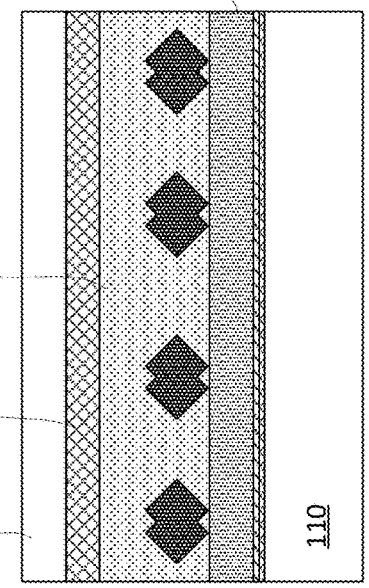
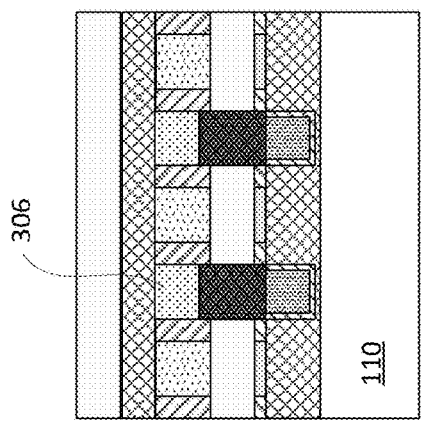
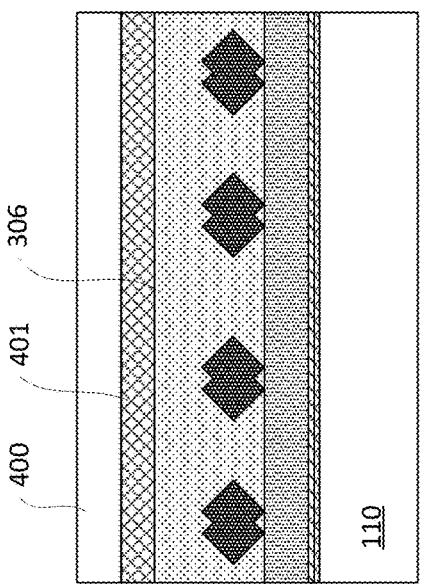
FIG. 9D
FIG. 9C
FIG. 9B
FIG. 9A

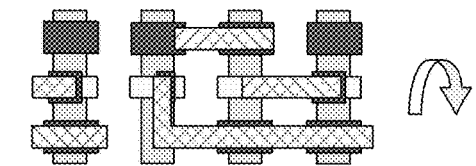
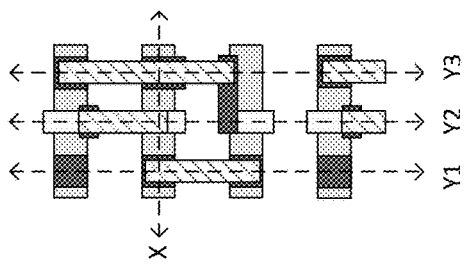
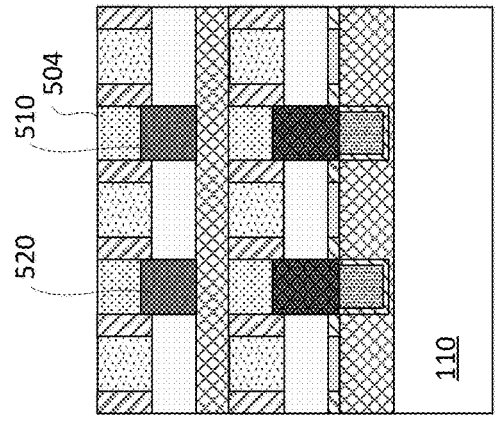
FIG. 10D
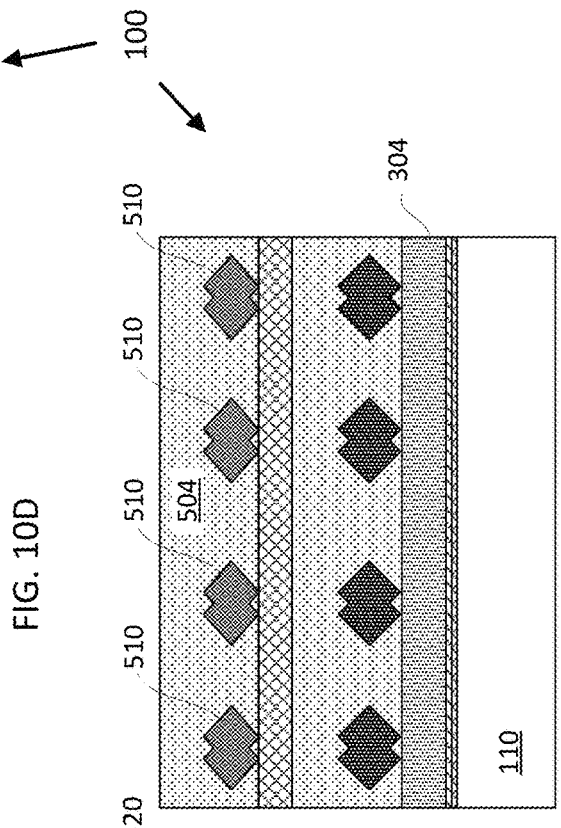
FIG. 10C
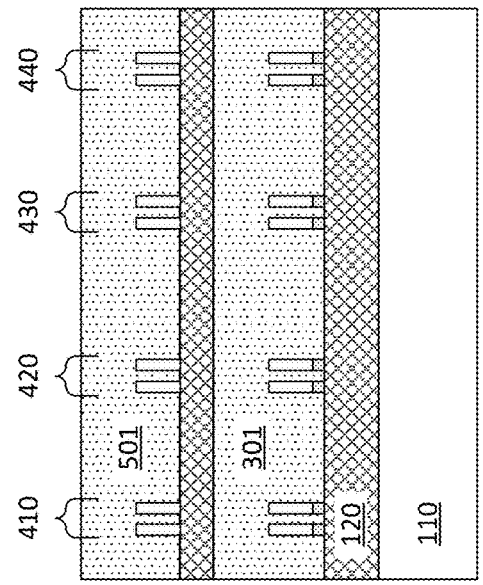
FIG. 10B
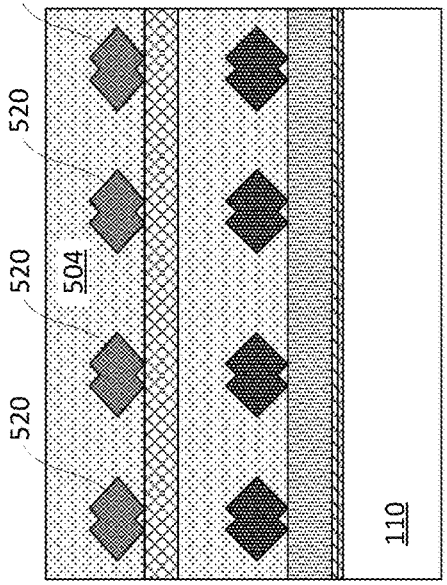
FIG. 10A

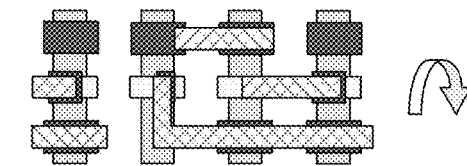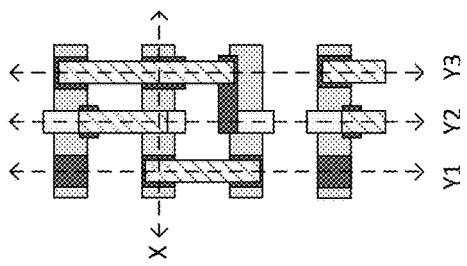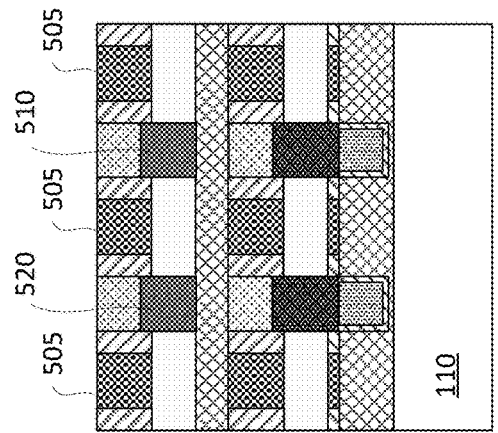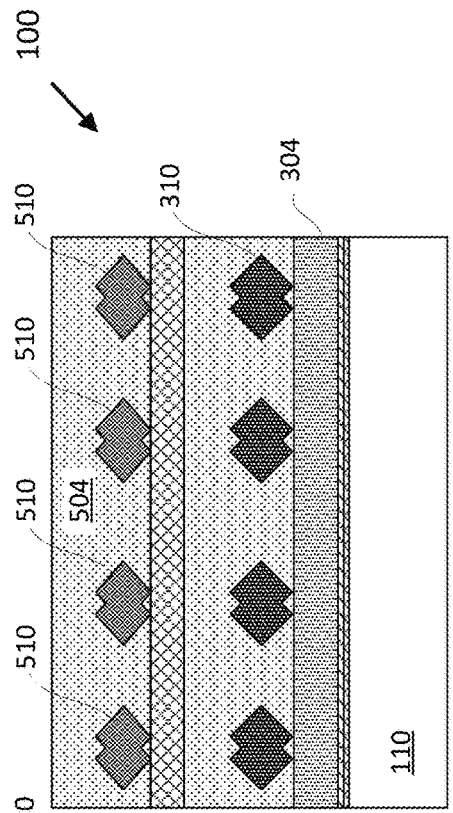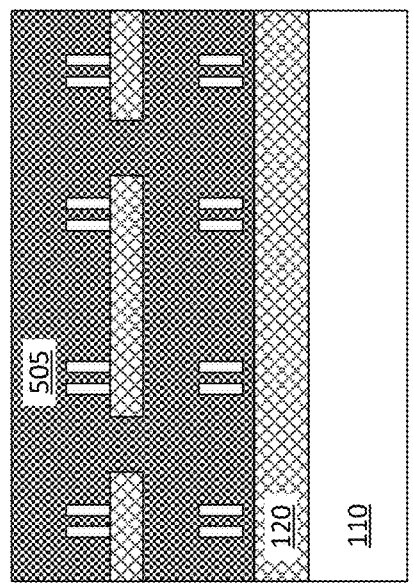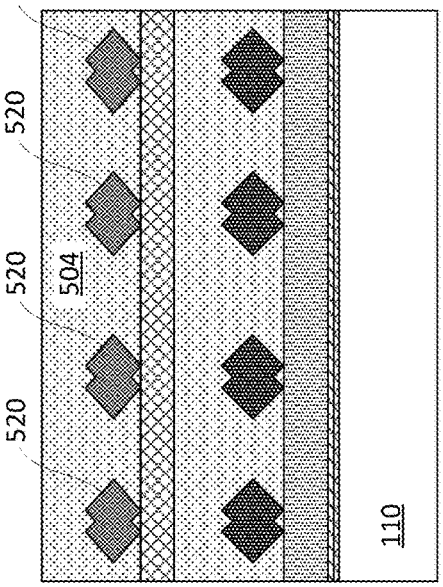
FIG. 12A
FIG. 12B
FIG. 12C
FIG. 12D

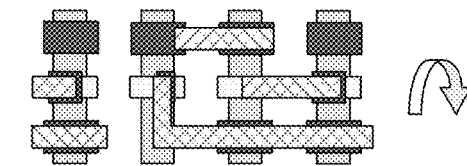
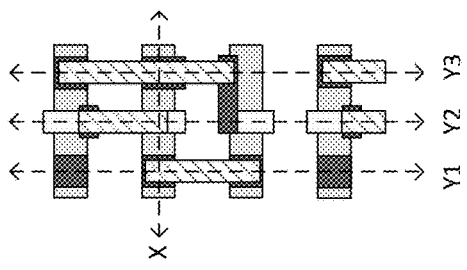
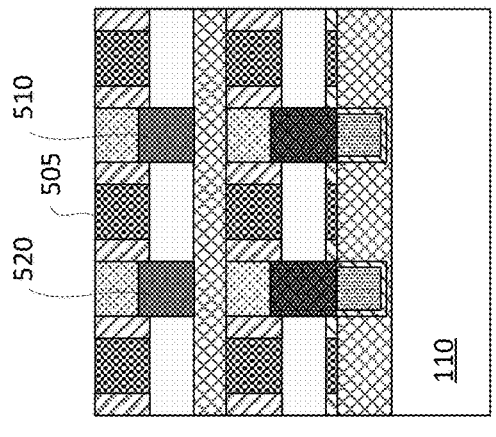
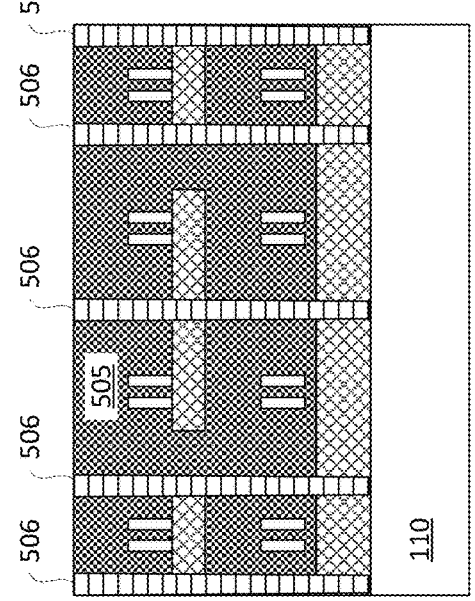
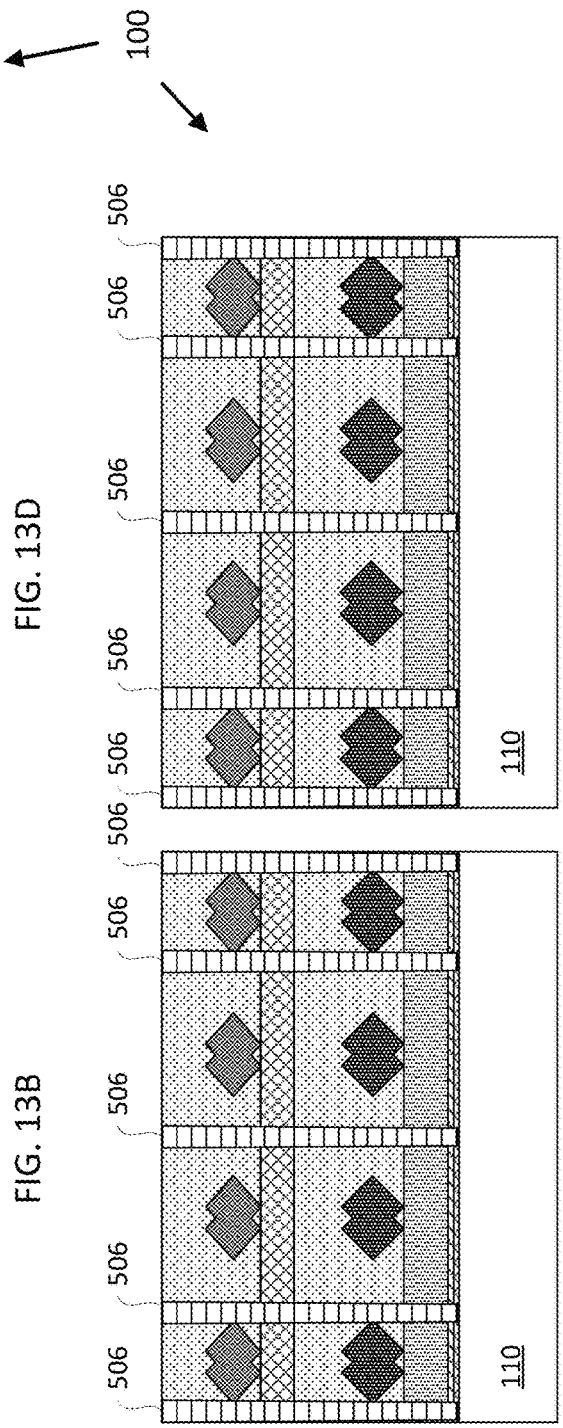
FIG. 13A
FIG. 13B
FIG. 13C
FIG. 13D

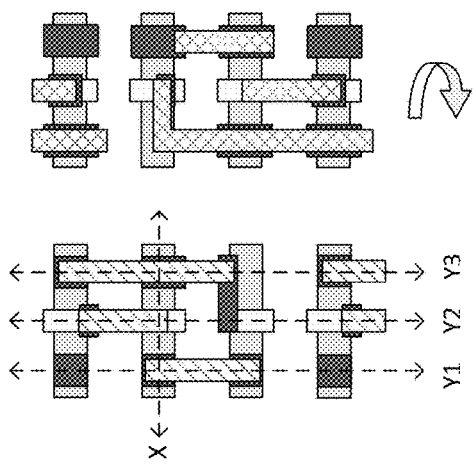
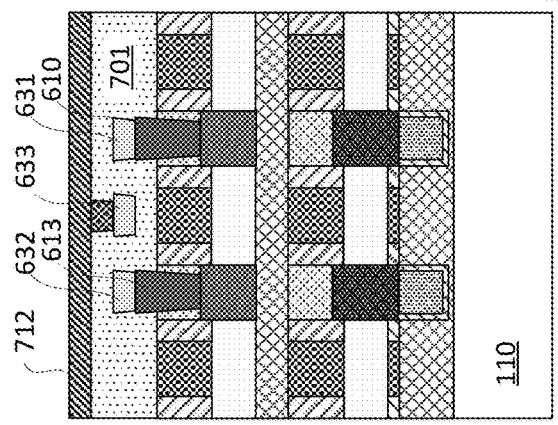
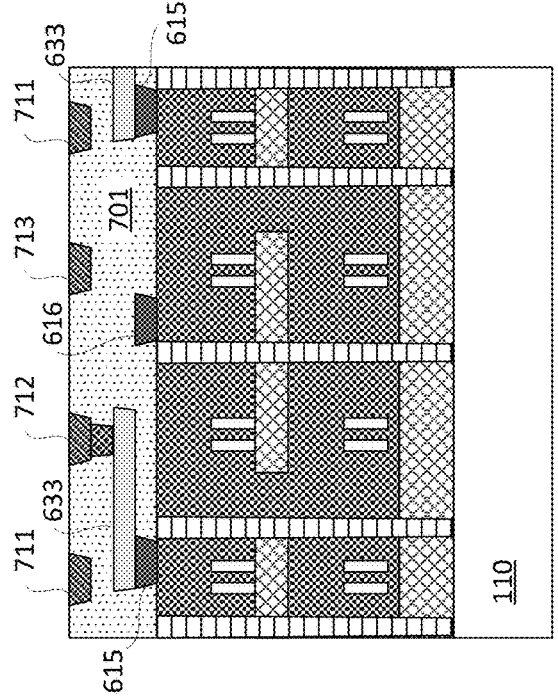
FIG. 14B
FIG. 14A
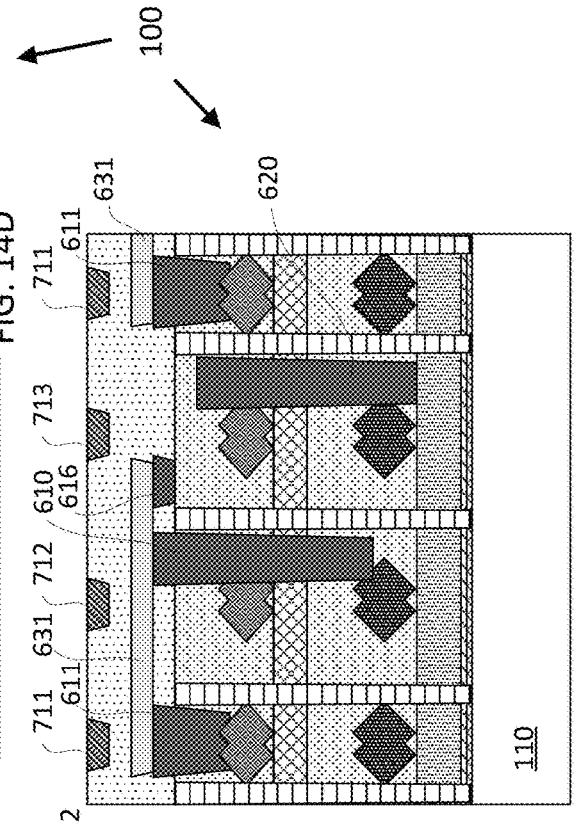
FIG. 14D
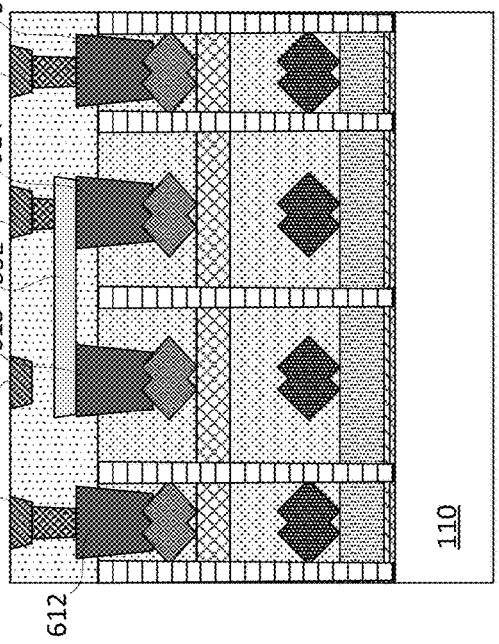
FIG. 14C

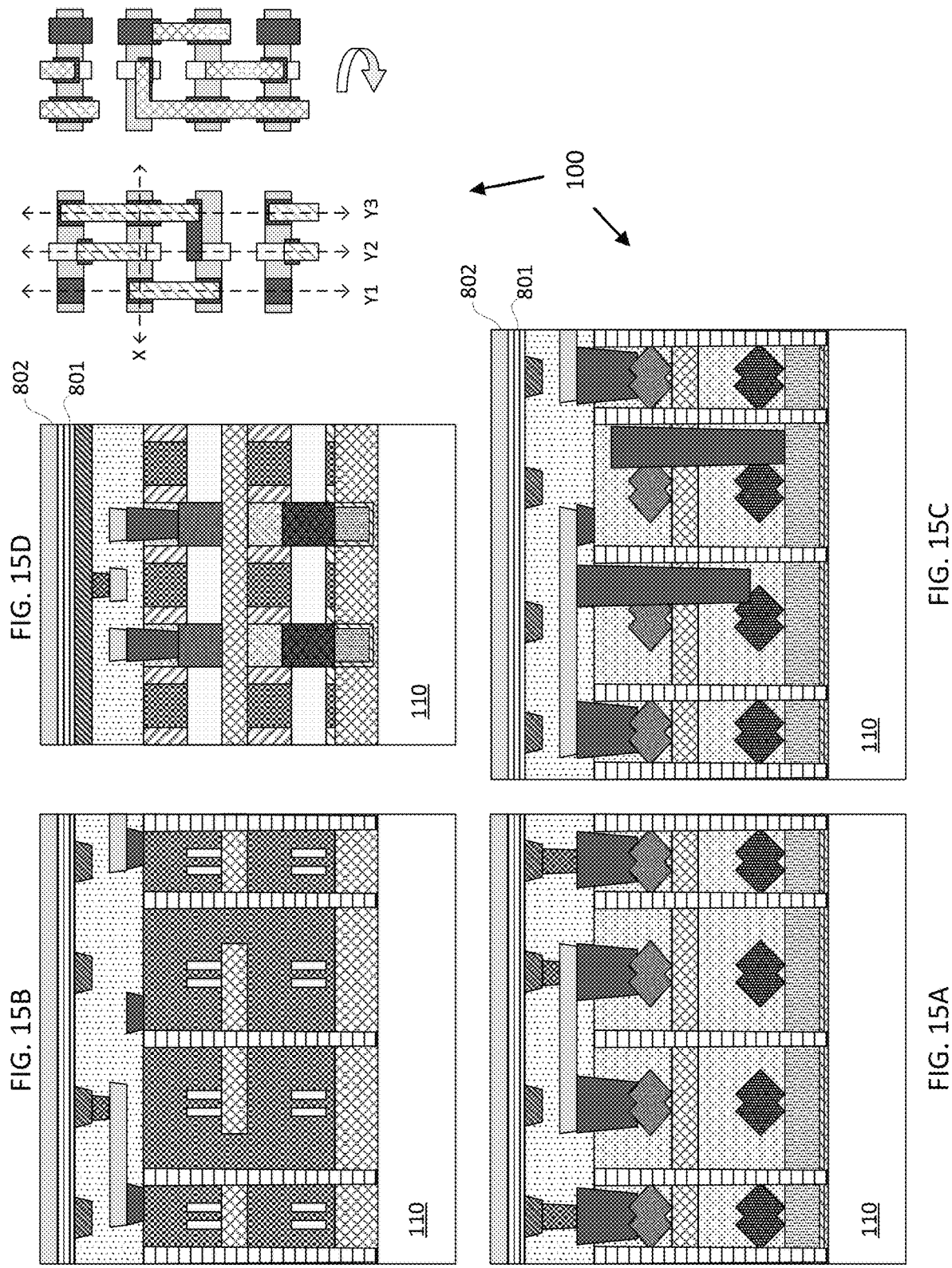

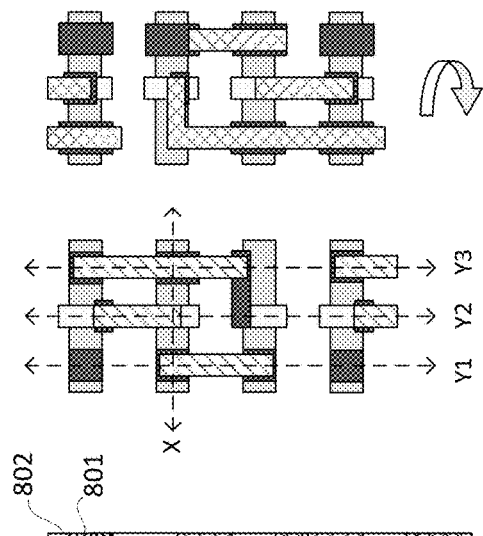
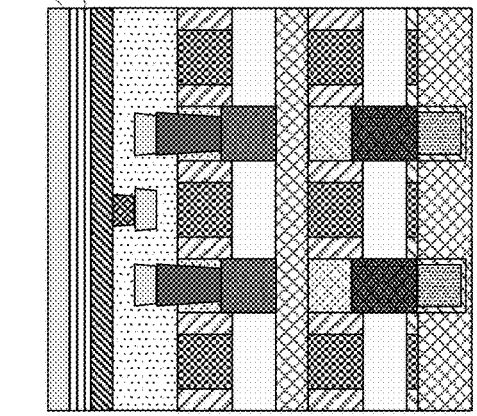
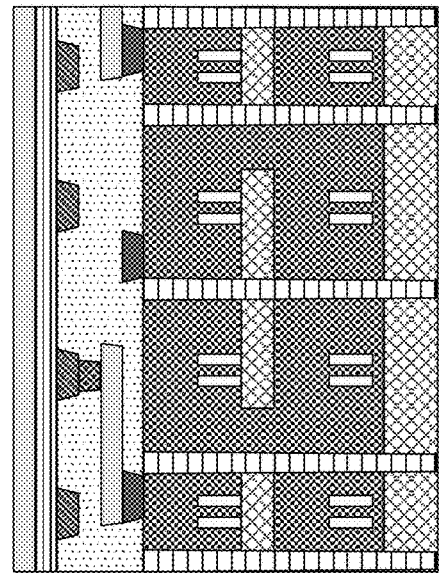
FIG. 16D
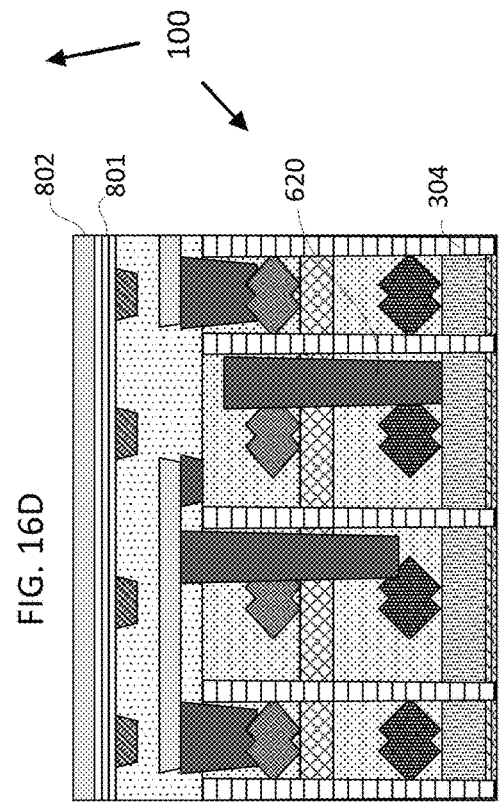
FIG. 16C
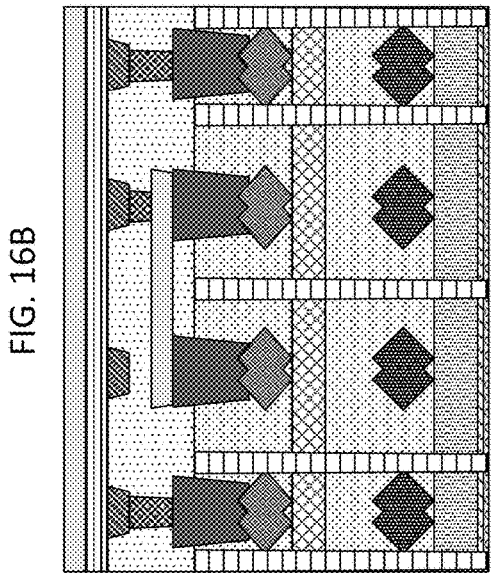
FIG. 16B
FIG. 16A

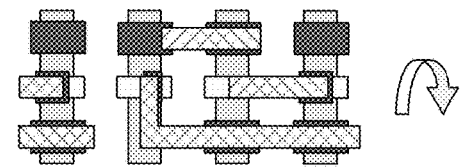
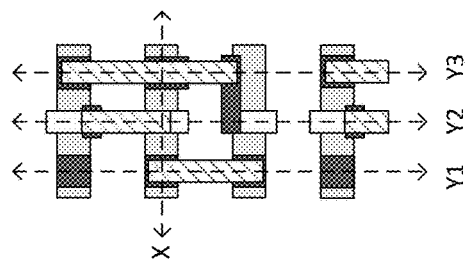
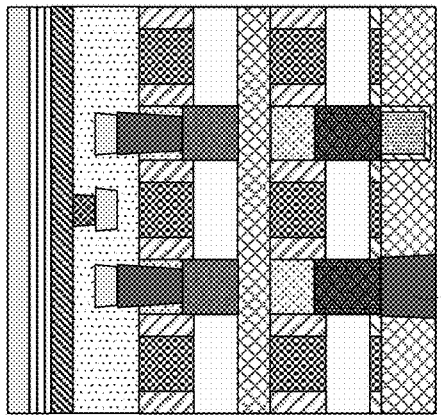
FIG. 17B
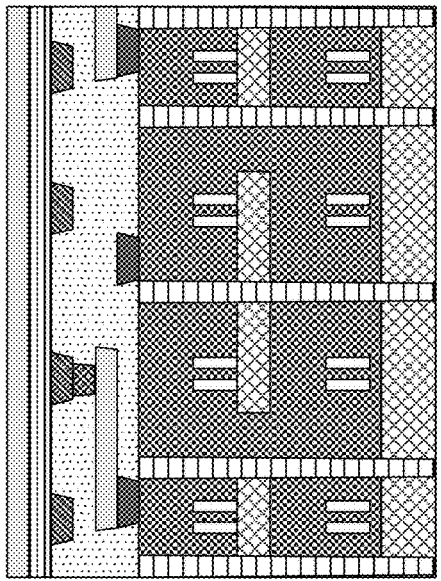
FIG. 17A
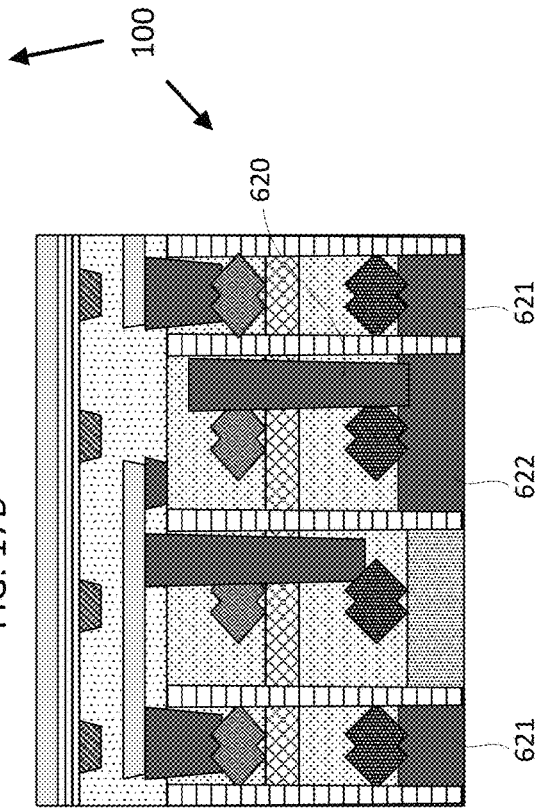
FIG. 17D
FIG. 17C

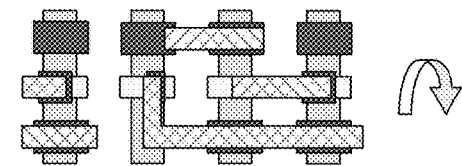
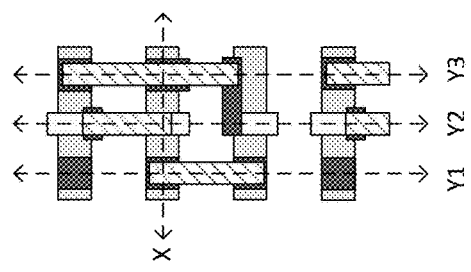
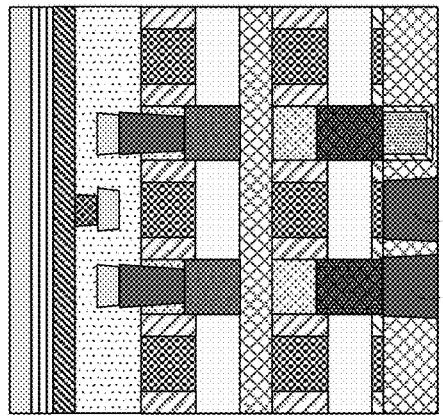
FIG. 18B
FIG. 18D
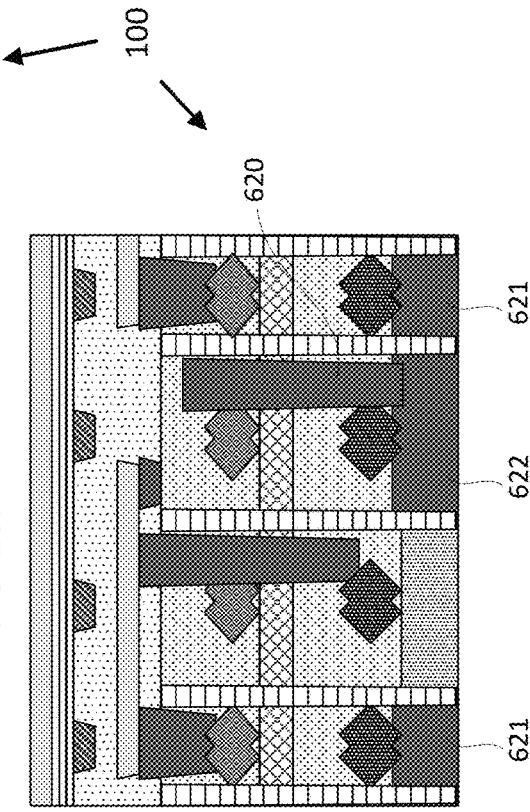
FIG. 18A
FIG. 18C

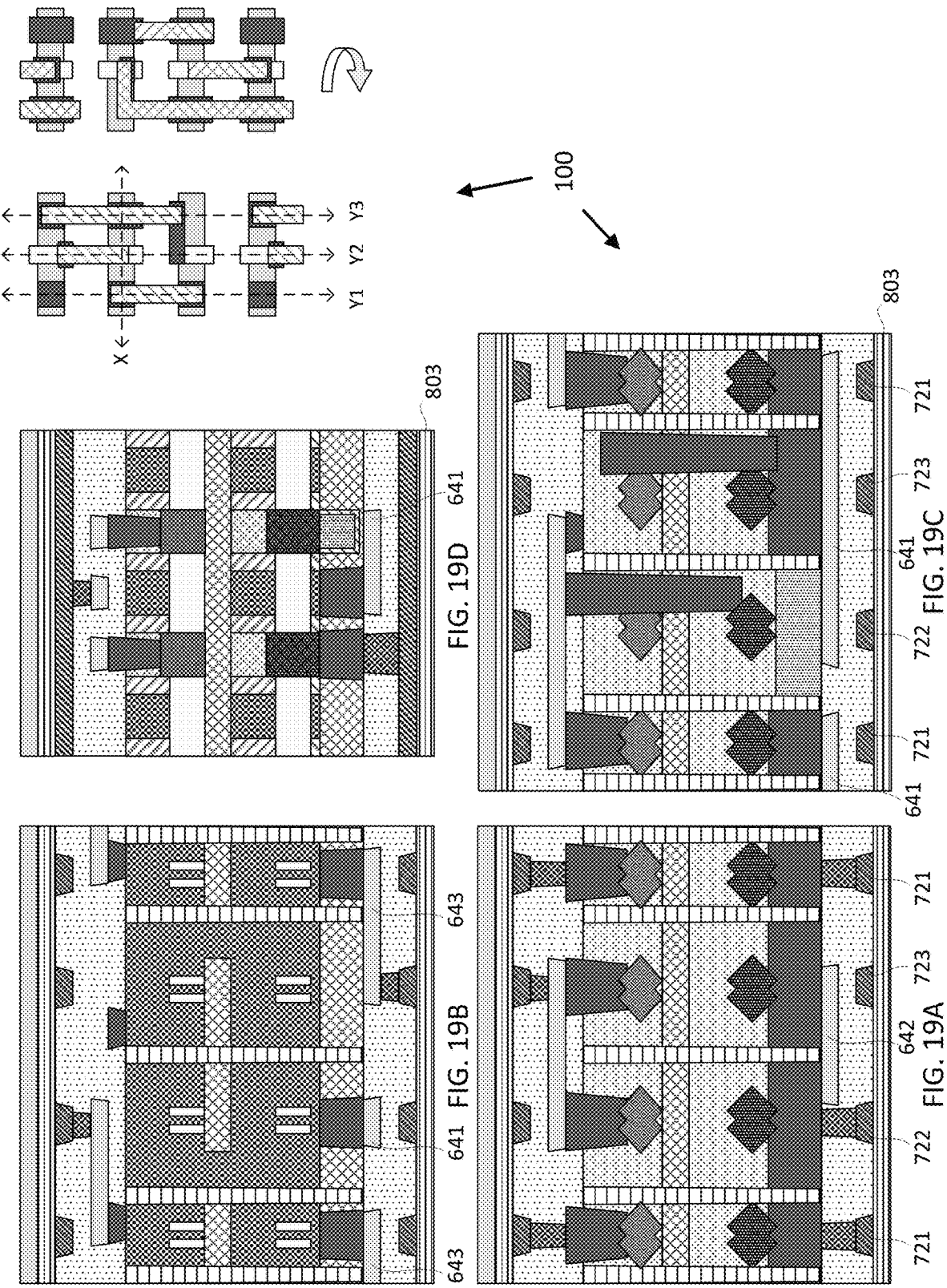

STACKED FET SRAM

BACKGROUND

The present application relates to manufacturing of semiconductor integrated circuits. More particularly, it relates to a stacked static random-access-memory (SRAM) structure and method of manufacturing the same.

Semiconductor transistors are the most fundamental building blocks or elements for modern integrated circuits. Transistors such as field-effect-transistors (FETs) come in a variety of shapes and forms, e.g., planar transistors, fin-type transistors, nanosheet or nanowire transistors, vertical transistors, etc. By the type of dopant carriers, transistors are typically classified as either n-type transistors (NFET) or p-type transistors (PFET) wherein the "n-type" or "p-type" designation is based upon the type of dopants that are used to create the channel and source/drain (S/D) regions of the transistors. Irrespective of the physical configuration, each transistor includes S/D regions and a gate region with a gate electrode structure positioned above and between the S/D regions. Upon application of an appropriate controlling or bias voltage to the gate electrode, a conductive channel region may be formed between the S/D regions. A conventional transistor is a planar FET wherein the entire channel region of the transistor is formed parallel to and slightly below a planar upper surface of the semiconductor substrate. In contrast to a planar FET, there are so-called 3D transistors such as fin-type transistors known as FinFETs, vertical transistors, and nanosheet or nanowire transistors that are three-dimensional in structure.

Semiconductor transistors are typically arranged in a particular configuration or pattern that allows the transistors to be interconnected to function as a unit. For example, a static random-access memory (SRAM) typically includes two PFET transistors and four NFET transistors, known as 6T, with different interconnects between the gates and S/D regions to create the memory cell. The various transistors consume area in the circuit layout, resulting in a minimum cell area. Generally, reducing the cell area is desirable but it requires an advancement in the process used that allows smaller transistors to be fabricated. It would be useful to reduce cell area without requiring fundamental change in the current fabrication processes.

SUMMARY

Embodiments of present invention provide a SRAM device. The SRAM device includes at least a first and a second SRAM cell, the first and the second SRAM cell having a first and a second pass-gate (PG) transistor respectively, wherein the second PG transistor of the second SRAM cell and the first PG transistor of the first SRAM cell are stacked in a first PG transistor cell.

In one embodiment, the SRAM device further includes a third SRAM cell. The third SRAM cell includes a first and a second PG transistor, wherein the first PG transistor of the third SRAM cell and the second PG transistor of the first SRAM cell are stacked in a second PG transistor cell.

In another embodiment, the first PG transistor of the first SRAM cell is stacked on top of the second PG transistor of the second SRAM cell and the first PG transistor of the third SRAM cell is stacked on top of the second PG transistor of the first SRAM cell.

In yet another embodiment, the first SRAM cell has a first pull-up (PU) transistor and a first pull-down (PD) transistor that are stacked in a first PU/PD transistor cell and has a second PU transistor and a second PD transistor that are stacked in a second PU/PD transistor cell.

Embodiments of present invention also provide a method of manufacturing a SRAM device. The method includes forming a first pass-gate (PG) transistor of a first SRAM cell in a first PG transistor cell; and forming a second PG transistor of a second SRAM cell in the first PG transistor cell, stacked together with the first PG transistor of the first SRAM cell.

In one embodiment, the method further includes forming a second PG transistor of the first SRAM cell in a second PG transistor cell; and forming a first PG transistor of a third SRAM cell in the second PG transistor cell, stacked together with the second PG transistor of the first SRAM cell.

BRIEF DESCRIPTION OF THE DRAWINGS

The present invention will be understood and appreciated more fully from the following detailed description of embodiments of present invention, taken in conjunction with accompanying drawings of which:

FIGS. 4A, 4B, 4C and 4D to FIGS. 19A, 19B, 19C and 19D are demonstrative illustrations of various cross-sectional views of a SRAM device during a process of manufacturing thereof according to embodiments of present invention;

Figure 1:
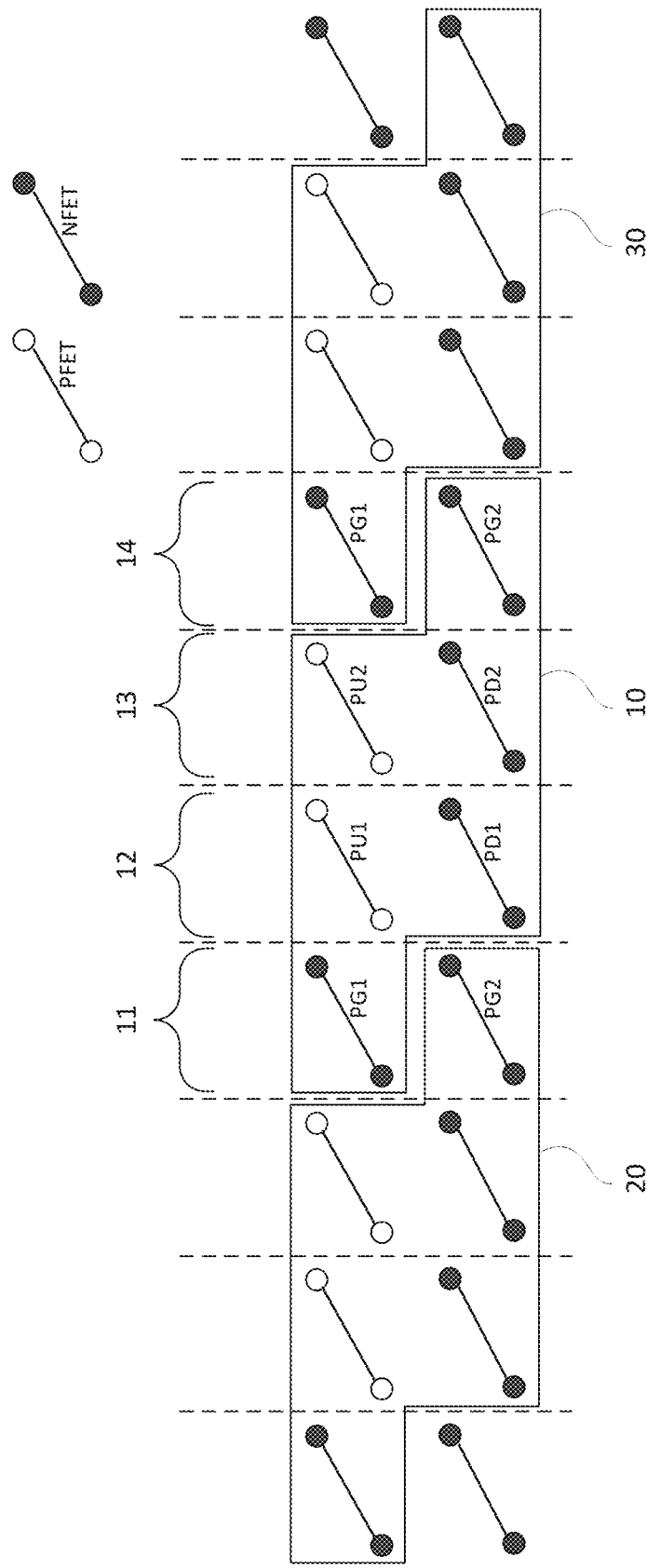
FIG. 1 is a simplified schematic illustration of three SRAM cells partially stacked together according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to the different structural orientations of the semiconductor structures shown throughout the drawings, XYZ Cartesian coordinates may be shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Moreover, the same or similar reference numbers are used throughout the drawings to denote the same or similar features, elements, or structures, and thus, a detailed explanation of the same or similar features, elements, or structures may not be repeated for each of the drawings for economy of description.

FIG. 1 is a simplified schematic illustration of three SRAM cells partially stacked together according to one embodiment of present invention. More specifically, FIG. 1 illustrates a first SRAM cell 10, a second SRAM cell 20, and a third SRAM cell 30 with each being made of two p-type transistors (PFET) and four n-type transistors (NFET). Here, two open circles connected by a straight line represent a PFET, and two solid circles connected by a straight line represent an NFET.

Each SRAM cell may include four transistor cells. For example, the first SRAM cell 10 includes a first pass-gate (PG) transistor cell 11, a first pull-up (PU)/pull-down (PD) transistor cell 12, a second PU/PD transistor cell 13, and a second PG transistor cell 14. The second SRAM cell 20 and the third SRAM cell 30 may include transistor cells that are similar to those of the first SRAM cell 10 and thus are not specifically listed here. Moreover, a first PG transistor PG1 of the first SRAM cell 10 may be stacked together with a second PG transistor PG2 of the second SRAM cell 20, which together may share the first PG transistor cell 11. Similarly, a second PG transistor PG2 of the first SRAM cell 10 may be stacked together with a first PG transistor PG1 of the third SRAM cell 30, which may together share the second PG transistor cell 14.

In FIG. 1, the first PG transistor PG1 of the first SRAM cell 10 may be illustrated to be stacked on top of the second PG transistor PG2 of the second SRAM cell 20, and the second PG transistor PG2 of the first SRAM cell 10 may be illustrated to be stacked underneath the first PG transistor PG1 of the third SRAM cell 30. However, embodiments of present invention are not limited in this aspect. For example, as being schematically illustrated in FIG. 2, the first PG transistor PG1 and the second PG transistor PG2 of the first SRAM cell 10 may be stacked underneath the second PG transistor PG2 of the second SRAM cell 20 and the first PG transistor PG1 of the third SRAM cell 30 respectively. In another embodiment, the first PG transistor PG1 and the second PG transistor PG2 of the first SRAM cell 10 may be stacked on top of the second PG transistor PG2 of the second SRAM cell 20 and the first PG transistor PG1 of the third SRAM cell 30 respectively.

Figure 2:
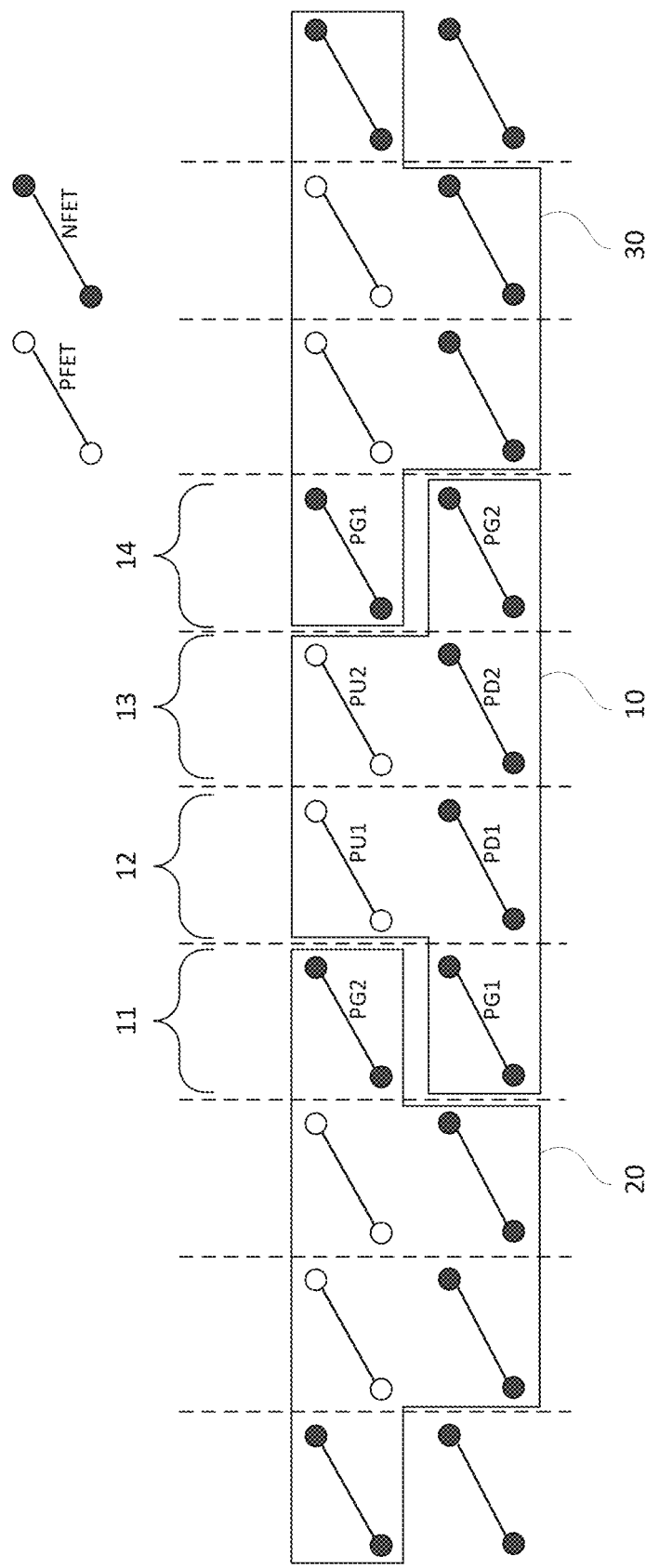
FIG. 2 is a simplified schematic illustration of three SRAM cells partially stacked together according to another embodiment of present invention.

Hereinafter, embodiments of present invention will be described with reference to FIG. 1 where the first PG transistor PG1 of the first SRAM cell 10 is stacked on top of the second PG transistor PG2 of the second SRAM cell 20 and the second PG transistor PG2 of the first SRAM cell 10 is stacked underneath the first PG transistor PG1 of the third SRAM cell. However, a person skilled in the art will appreciate that similar description may be applied to embodiments that are illustrated in FIG. 2.

Figure 3:
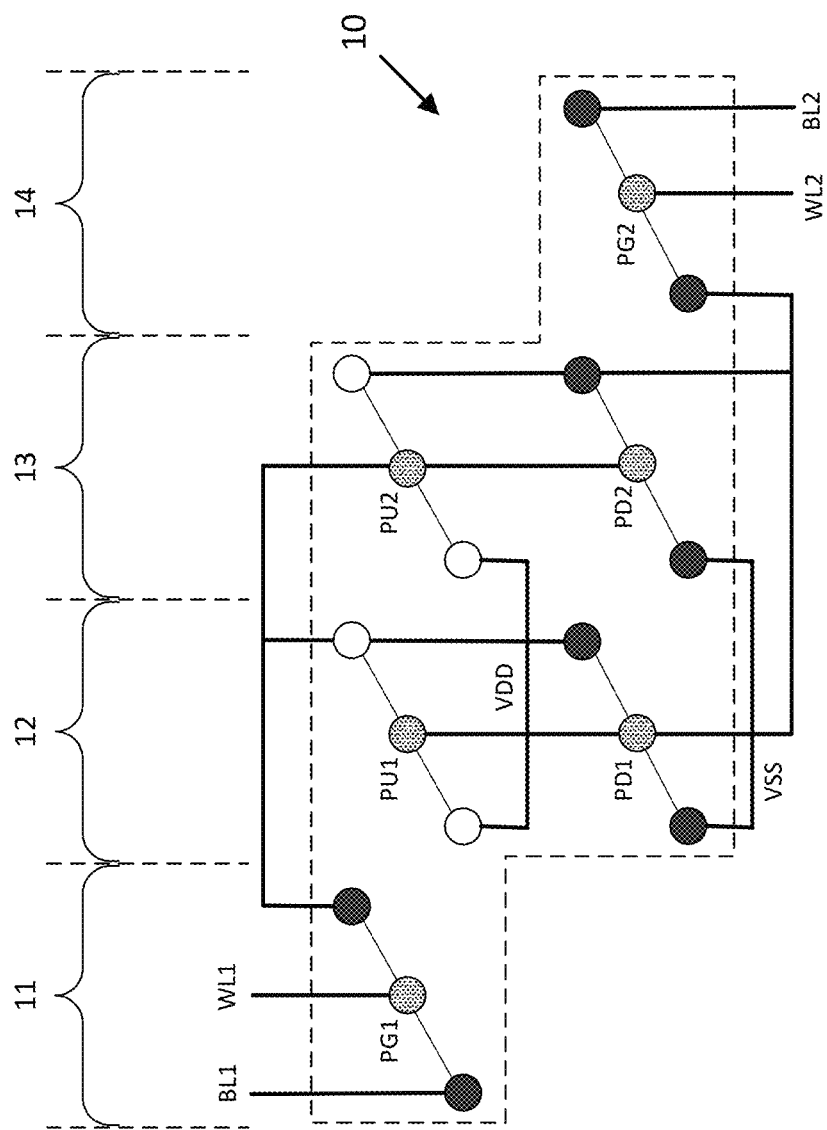
FIG. 3 is a simplified schematic illustration of a SRAM cell according to one embodiment of present invention.
Figure 11A:
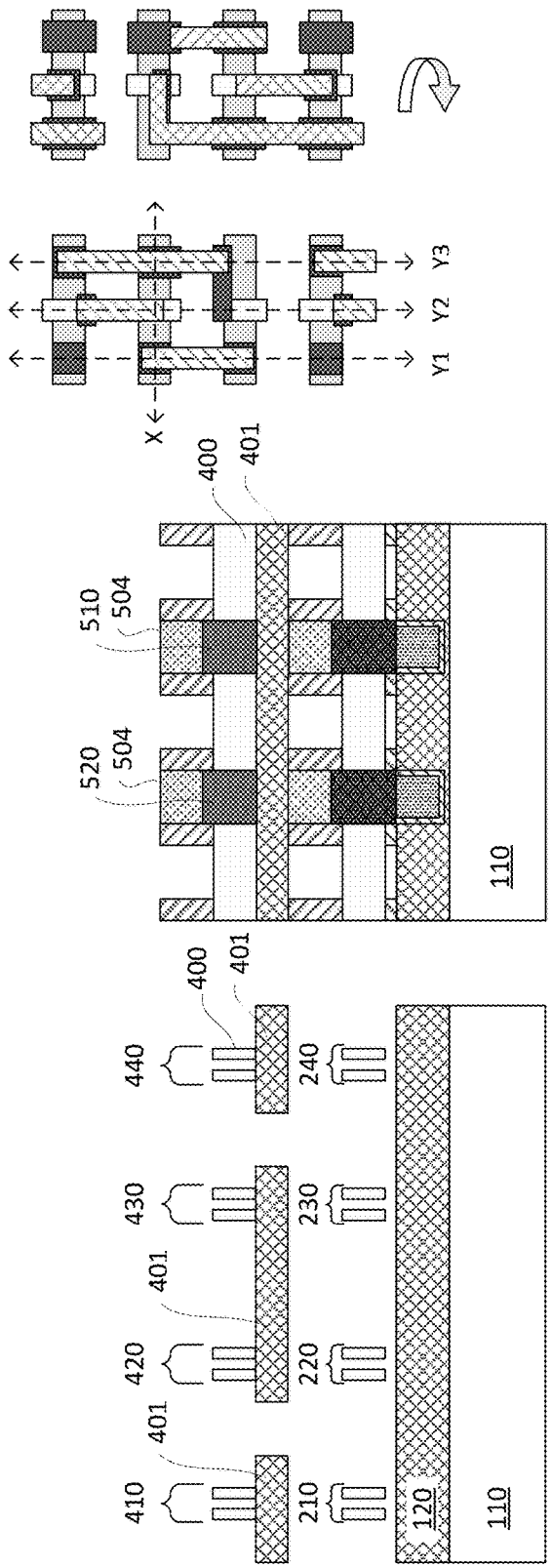
Figure 11B:
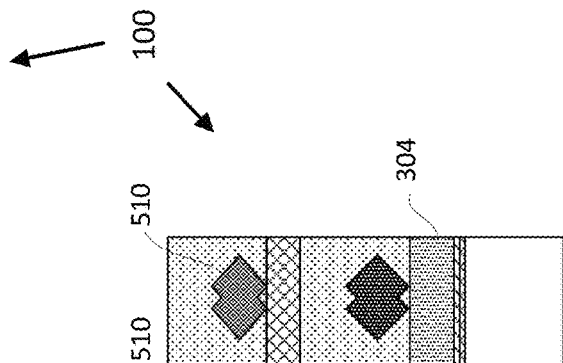
Figure 11C:
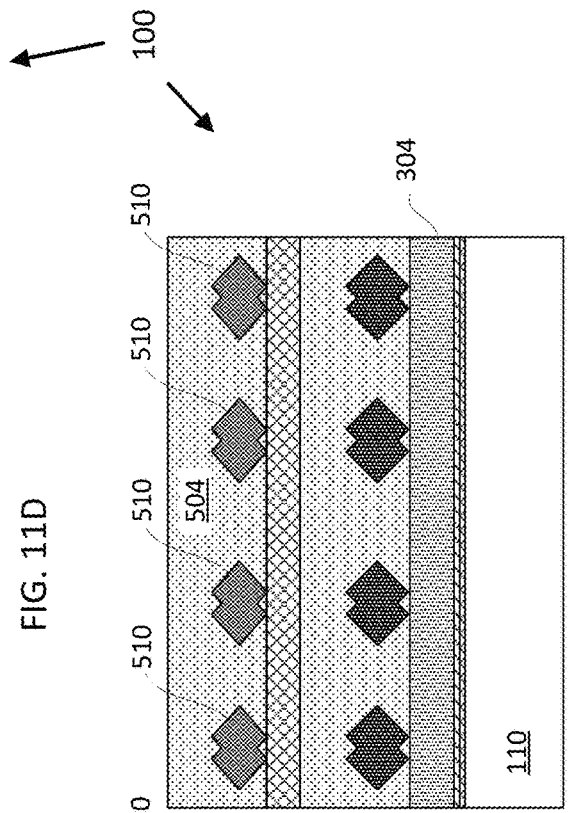
Figure 11D:
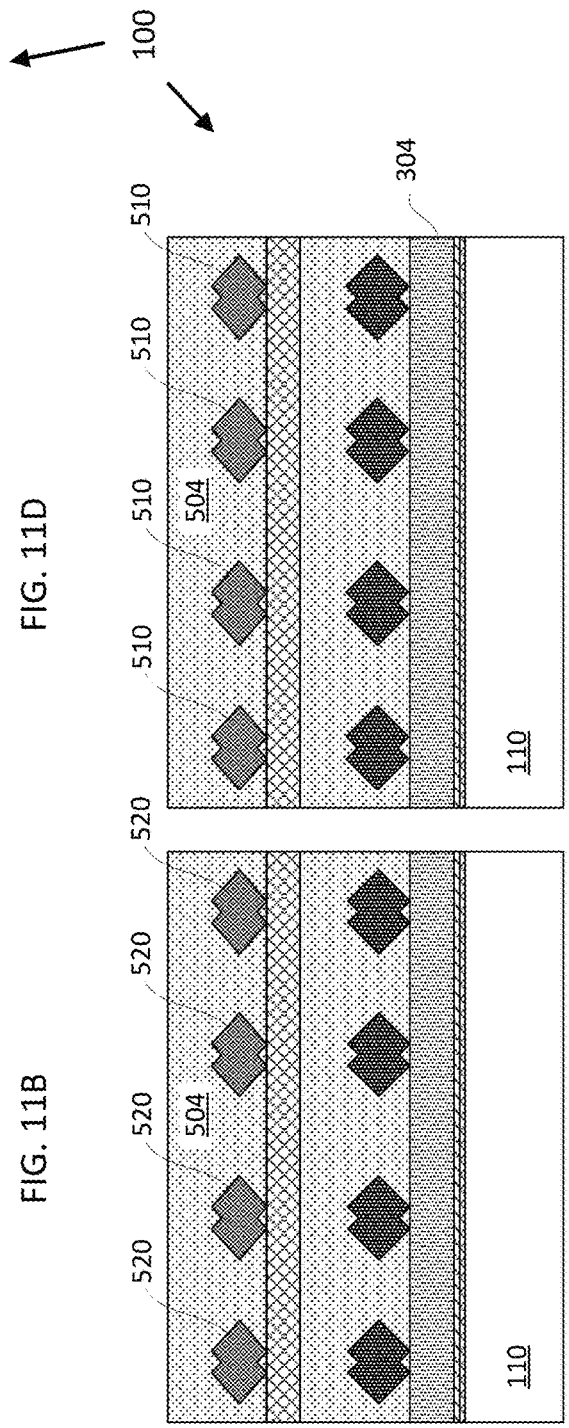

FIG. 3 is a simplified schematic illustration of a SRAM cell according to one embodiment of present invention. More particularly, FIG. 3 illustrates the SRAM cell 10, as is illustrated in FIG. 1, that includes the first PG transistor cell 11, the first PU/PD transistor cell 12, the second PU/PD transistor cell 13, and the second PG transistor cell 14. A first bit line BL1 and a first word line WL1 of the first SRAM cell 10 may be connected to a second source/drain region and a gate metal of the first PG transistor PG1 in the first PG transistor cell 11, and a second bit line BL2 and a second word line WL2 of the first SRAM cell 10 may be connected a second source/drain region and a gate metal of the second PG transistor PG2 in the second PG transistor cell 14.

A first PU transistor PU1 and a first PD transistor PD1 may be stacked together in the first PU/PD transistor cell 12, and a second PU transistor PU2 and a second PD transistor PD2 may be stacked together in the second PU/PD transistor cell 13. As being illustrated in FIG. 3, the first and second PU transistors may be stacked on top of the first and second PD transistors. However, embodiments of present invention are not limited in this aspect and the first and second PD transistors may be stacked on top of the first and second PU transistors.

As being illustrated in FIG. 3, first source/drain regions of the first PU transistor PU1 and the first PD transistor PD1 may be connected, directly or through a cross-couple or a local interconnect, to a first source/drain region of the first PG transistor PG1 and gates of the second PU transistor PU2 and the second PD transistor PD2; first source/drain regions of the second PU transistor PU2 and the second PD transistor PD2 may be connected, directly or through a cross-couple or a local interconnect, to a first source/drain region of the second PG transistor PG2 and gates of the first PU transistor PU1 and the first PD transistor PD1; a second source/drain region of the first PU transistor PU1 and a second source/drain region of the second PU transistor PU2 are connected to a VDD source supply line; and a second source/drain region of the first PD transistor PD1 and a second source/drain region of the second PD transistor PD2 are connected to a VSS power supply line.

FIGS. 4A, 4B, 4C and 4D to FIGS. 19A, 19B, 19C and 19D are demonstrative illustrations of various cross-sectional views of a SRAM device during a process of manufacturing thereof according to embodiments of present invention. More specifically, FIGS. 4A, 4B, 4C and 4D to FIGS. 19A, 19B, 19C and 19D include, in their upper right corner, two simplified layout views of the SRAM device, with a top view at the left side, and a bottom view at the right side when the SRAM device is flipped upside-down along a direction indicated by the curved arrow.

With reference to the top view of the layout of the SRAM device, figures denoted with a letter "A" illustrate cross-sectional views along dashed line Y1 at a first source/drain region; figures denoted with a letter "B" illustrate cross-sectional views along dashed line Y2 across fins; figures denoted with a letter "C" illustrate cross-sectional views along dashed line Y3 at a second source/drain region; and figures denoted with a letter "D" illustrate cross-sectional views along dashed line X across gate. In the below embodiments, for illustration purpose, finFET transistors are illustrated as forming SRAM cells. However, embodiments of present invention are not limited in this aspect and other types of transistors may be used as well.

More specifically, FIGS. 4A, 4B, 4C, and 4D are demonstrative illustrations of various cross-sectional views of a SRAM device 100 during a process of manufacturing thereof according to embodiments of present invention. The SRAM device 100 may include a substrate 110, an oxide layer 120 on top of the substrate 110, and a semiconductor layer 201 on top of the oxide layer 120. The substrate 110 may be a bulk semiconductor substrate such as a bulk silicon substrate, a bulk germanium (Ge) substrate or a bulk silicon-germanium (SiGe) substrate. Other types of substrates may be used as well. The semiconductor layer 201 may be a silicon (Si) layer or a silicon-germanium (SiGe) layer. In one embodiment, the semiconductor layer 201, the oxide layer 120, and the substrate 110 may be part of a silicon-on-insulator (SOI) substrate or a silicon-germanium-on-insulator (SGOI) substrate. The semiconductor layer 201 at the top may be subsequently patterned.

In one embodiment, a semiconductor layer 200 of, for example, silicon (Si) or silicon-germanium (SiGe) material may be formed on top of the semiconductor layer 201. For example, in one embodiment, the semiconductor layer 201 may be a SiGe layer, and the semiconductor layer 200 may be a Si layer. The semiconductor layer 200 may be patterned to form a plurality of fins that are used to form pull-down (PD) transistors and pass-gate (PG) transistors of the SRAM device 100. For example, the plurality of fins may be used to form a second PG transistor 210 of a neighboring SRAM cell such as the SRAM cell 20 as in FIG. 1, a second PG transistor 240 of current SRAM cell such as the SRSM cell 10 in FIG. 1, a first PD transistor 220, and a second PD transistor 230 as being described below in more details. The plurality of fins may be covered by a sacrificial gate 301 such as, for example, a polysilicon dummy gate that may subsequently be replaced by a gate metal in a replacement-metal-gate (RMG) process later. The sacrificial gate 301 may be covered by a cap layer 302 at the top and sidewall spacers 303 at the sidewalls.

Here, dashed lines Y1, Y2, and Y3 in FIG. 4D illustrate positions of cross-sectional views of FIGS. 4A, 4B, and 4C, respectively, and correspond to Y1, Y2, and Y3 in the simplified layout view at the upper right corner of the page.

FIGS. 5A, 5B, 5C, and 5D are demonstrative illustrations of various cross-sectional views of the SRAM device 100 during a process of manufacturing thereof, following a step illustrated in FIGS. 4A, 4B, 4C, and 4D, according to embodiments of present invention. More specifically, embodiments of present invention provide recessing and removing source/drain regions (i.e., the areas indicated by the dashed lines Y1 and Y3) between the gates and removing a substantial portion of the oxide layer underneath the source/drain regions. The recessing and removing may be provided through a reactive-ion-etching (RIE) process.

FIGS. 6A, 6B, 6C, and 6D are demonstrative illustrations of various cross-sectional views of the SRAM device 100 during a process of manufacturing thereof, following a step illustrated in FIGS. 5A, 5B, 5C, and 5D, according to embodiments of present invention. The recessing and removing of source/drain regions as in the previous step expose a sidewall of the semiconductor layer 201 underneath the semiconductor layer 200 that forms the plurality of fins. Embodiments of present invention provide creating indentation at the semiconductor layer 201. For example, in one embodiment, the semiconductor layer 201 is a SiGe layer and the semiconductor layer 200 is a Si layer. The semiconductor layer 201 may have its SiGe material, at areas close to the source/drain regions, selectively etched away to become the semiconductor layer 202. The indentation created by the removal of the end portions of the semiconductor layer 201 may be replaced subsequently, as being described below in more details, with a dielectric material to form inner spacers of the finFET transistors.

FIGS. 7A, 7B, 7C, and 7D are demonstrative illustrations of various cross-sectional views of the SRAM device 100 during a process of manufacturing thereof, following a step illustrated in FIGS. 6A, 6B, 6C, and 6D, according to embodiments of present invention. More specifically, embodiments of present invention provide lining the openings created by the recessing and removing of the source/drain regions and the indentation of the semiconductor layer 201 with one or more inner spacer liners such as, for example, silicon-nitride (SiN) silicon-nitride-carbon-oxide (SiOCN), or silicon-carbon-oxide (SiOC). Following the lining of the openings, a dielectric material 304 may be deposited to fill in the remaining openings. The dielectric material 304 may be silicon-carbide (SiC), boron-doped silicon-carbon-nitride (SiBCN), SiOC, or SiN, to name a few. The deposition of dielectric material 304 may be optionally followed by a chemical-mechanic-polishing (CMP) process to create a top surface that is planar with, for example, the gate cap layer 302.

FIGS. 8A, 8B, 8C, and 8D are demonstrative illustrations of various cross-sectional views of the SRAM device 100 during a process of manufacturing thereof, following a step illustrated in FIGS. 7A, 7B, 7C, and 7D, according to embodiments of present invention. More specifically, embodiments of present invention provide recessing dielectric material 304 to a level such that epitaxial source/drain of finFET transistors may be formed. For example, the dielectric material 304 and any inner spacer liners may be selectively, and isotopically, etched down to a level at or below the indentation at the semiconductor layer 202, with the liner material in the indentation remain unetched. In other words, the dielectric material 304 may remain in the openings in the oxide layer 120. Next, embodiments of present invention provide forming the first source/drain regions 310 and the second source/drain regions 320 in the recessed openings next to the sidewalls of fins of the semiconductor layer 200. The first and second source/drain regions may be formed through epitaxial growth process. The epitaxial growth process may create merged diamond shaped source/drain regions as being demonstratively illustrated in FIG. 8A and FIG. 8B.

FIGS. 9A, 9B, 9C, and 9D are demonstrative illustrations of various cross-sectional views of the SRAM device 100 during a process of manufacturing thereof, following a step illustrated in FIGS. 8A, 8B, 8C, and 8D, according to embodiments of present invention. More specifically, embodiments of present invention provide depositing dielectric material 306 on top of the first and second source/drain regions 310 and 320. Subsequent to the deposition, a CMP process may be applied to remove and polish off excessive portions of the dielectric material 306 to create a planar top surface of the SRAM device 100. Next, embodiments of present invention provide wafer-bonding a new semiconductor layer 400, such as a silicon layer, which may be used as finFET channel material for pull-up (PU) transistors and pass-gate (PG) transistors of the SRAM device 100 as being described below in more details. The semiconductor layer 400 may be wafer-bonded to the top of the SRAM device 100, such as the sacrificial gate 301 and the dielectric material 306, through a bonding agent. The bonding agent may be, for example, an oxide bonding layer 401 although other types of bonding agent may be used as well.

FIGS. 10A, 10B, 10C, and 10D are demonstrative illustrations of various cross-sectional views of the SRAM device 100 during a process of manufacturing thereof, following a step illustrated in FIGS. 9A, 9B, 9C, and 9D, according to embodiments of present invention. More specifically, embodiments of present invention provide patterning the semiconductor layer 400 into a plurality of fins. The plurality of fins may be used to form a first PG transistor 410 of current SRAM cell such as the SRAM cell 10 as in FIG. 1, a first PG transistor 440 of a neighboring SRAM cell such as the SRAM cell 30 as in FIG. 1, a first PU transistor 420, and a second PU transistor 430 as being described below in more details. The plurality of fins may be covered by a sacrificial gate 501 such as, for example, a polysilicon dummy gate that may be subsequently replaced by a gate metal in a RMG process. A first source/drain region 510 and a second source/drain region 520 of the PU and PG transistors may be epitaxially formed. The first and second source/drain regions may be formed at sidewalls of the plurality of fins and be subsequently covered by a dielectric material 504 through a deposition process. Excessive dielectric material 504 may be removed through, for example, a CMP process. The first PG transistor 410, the first PU transistor 420, the second PU transistor 430, and the first PG transistor 440 may be physically separated from the second PG transistor 210, the first PD transistor 220, the second PD transistor 230, and the second PG transistor 240 underneath thereof by the oxide bonding agent 401.

FIGS. 11A, 11B, 11C, and 11D are demonstrative illustrations of various cross-sectional views of the SRAM device 100 during a process of manufacturing thereof, following a step illustrated in FIGS. 10A, 10B, 10C, and 10D, according to embodiments of present invention. More specifically, embodiments of present invention proceed with forming gate metals surrounding the plurality of fins through a RMG process. For example, embodiments of present invention provide performing gate openings in the oxide bonding layer 401; selectively removing the sacrificial gate 301, the sacrificial gate 501, and the semiconductor layer 201 underneath fins of the semiconductor layer 200 as part of the RMG process.

FIGS. 12A, 12B, 12C, and 12D are demonstrative illustrations of various cross-sectional views of the SRAM device 100 during a process of manufacturing thereof, following a step illustrated in FIGS. 11A, 11B, 11C, and 11D, according to embodiments of present invention. More specifically, embodiments of present invention provide replacing the removed sacrificial gates 301 and 501 and the semiconductor layer 201 with a gate stack 505 through the RMG process. The gate stack 505, which includes a gate dielectric layer, work-function metal layers, and optional additional conductive metal layers, may be deposited through the openings in the oxide bonding layer 401 and opening created by the removal of the semiconductor layer 201 to surround fins of the semiconductor layer 200 and may be deposited to cover fins of the semiconductor layer 400.

FIGS. 13A, 13B, 13C, and 13D are demonstrative illustrations of various cross-sectional views of the SRAM device 100 during a process of manufacturing thereof, following a step illustrated in FIGS. 12A, 12B, 12C, and 12D, according to embodiments of present invention. More specifically, after the formation of the gate stack 505 through the RMG process, embodiments of present invention provide performing gate-cut that cuts not only through gate stacks but first and second source/drain regions of the finFET transistors. Trenches made through the gate-cut are subsequently filled with dielectric material 506.

FIGS. 14A, 14B, 14C, and 14D are demonstrative illustrations of various cross-sectional views of the SRAM device 100 during a process of manufacturing thereof, following a step illustrated in FIGS. 13A, 13B, 13C, and 13D, according to embodiments of present invention. More specifically, embodiments of present invention provide forming first internal contact 610, which may be known as a deep CA, connecting the first source/drain region 510 of the first PU transistor 420 with the first source/drain region 310 of the first PD transistor 220; and forming second internal contact 620, which may be known as a recessed CA, connecting the first source/drain region 510 of the second PU transistor 430 with the first source/drain region 310 of the second PD transistor 230.

Embodiments of present invention further provide forming CA contact 611 contacting the first source/drain region of the first PG transistor 410 (and of the first PG transistor 440); forming CA contact 612 contacting the second source/drain region of the first PG transistor 410 (and of the first PG transistor 440); forming CA contact 613 contacting the second source/drain region of the first PU transistor 420; forming CA contact 614 contacting the second source/drain region of the second PU transistor 430; forming CB contact 615 contacting the gate of the first PG transistor 410 (and of the first PG transistor 440); and forming CB contact 616 contacting the gate of the second PU transistor 430.

Embodiments of present invention also provide forming local interconnect (LI) 631 connecting the CA contact 611, the first internal contact 610, and the CB contact 616; forming LI 632 connecting the CA contact 613 and the CA contact 614; and forming LI 633 connected to the CB contact 615.

Embodiments of present invention further provide forming first bit line 711 connected to the CA contact 612 through a deep via (type-A); forming first word line 712 connected to the LI 633, which connects to the CB contact 615, through a short via (type-B); and forming VDD power supply line 713 connected to the LI 632, which connects to the CA 613 and the CA 614, through a short via (type-B).

FIGS. 15A, 15B, 15C, and 15D are demonstrative illustrations of various cross-sectional views of the SRAM device 100 during a process of manufacturing thereof, following a step illustrated in FIGS. 14A, 14B, 14C, and 14D, according to embodiments of present invention. More specifically, after forming CA/CB contacts, local interconnects, bit line, word line, and the power supply line, embodiments of present invention provide forming a plurality of back-of-the-line (BEOL) layers 801 on top of the SRAM device 100 and forming a handling wafer 802 onto BEOL layers 801 through, for example, a wafer-bonding process.

FIGS. 16A, 16B, 16C, and 16D are demonstrative illustrations of various cross-sectional views of the SRAM device 100 during a process of manufacturing thereof, following a step illustrated in FIGS. 15A, 15B, 15C, and 15D, according to embodiments of present invention. More specifically, after the handling wafer 802 is wafer-bonded onto the BEOL layers 801 at a frontside, the SRAM device 100 may be flipped upside down such that processing may continue at a backside of the SRAM device 100. Here, for the sake of illustration, the drawings are not shown upside down. However, as may be noticed from various illustrations hereafter, processing continues at the backside (bottoms of the drawings) of the SRAM device 100. More particularly, the substrate 110 may be first removed through a wafer grinding, CMP, and/or other etch processes.

FIGS. 17A, 17B, 17C, and 17D are demonstrative illustrations of various cross-sectional views of the SRAM device 100 during a process of manufacturing thereof, following a step illustrated in FIGS. 16A, 16B, 16C, and 16D, according to embodiments of present invention. More specifically, self-aligned backside S/D contacts (BSCA) may be formed at the backside of the SRAM device 100. For example, the dielectric material 304 may be selectively removed or etched away and replaced with conductive material such as metal to form a BSCA contact 621 to the first source/drain region of the second PG transistor 210 (and of the second PG transistor 240); to form a BSCA contact 622 to the first source/drain region of the second PD transistor 230 and the second internal contact 620; to form a BSCA contact 623 to the second source/drain region of the second PG transistor 210 (and of the second PG transistor 240); to form a BSCA contact 624 to second source/drain region of first PD transistor 220; and to form a BSCA contact 625 to the second source/drain region of the second PD transistor 230.

FIGS. 18A, 18B, 18C, and 18D are demonstrative illustrations of various cross-sectional views of SRAM device 100 during a process of manufacturing thereof, following a step illustrated in FIGS. 17A, 17B, 17C, and 17D, according to embodiments of present invention. More specifically, backside gate contacts (BSCB) may be formed at the backside of SRAM device 100. For example, the oxide layer 120 may be etched through a reactive-ion-etching (RIE) process, selective to the dielectric material 304 and the CA contacts 621-625, to create opening to the gate metal of the first PD transistor 220 and the second PG transistor 210 (and of the second PG transistor 240). Conductive materials such as metal may be used to fill in the openings to create a BSCB contact 626 contacting the gate of the first PD transistor 220 and to create a BSCB contact 627 contacting the gate of the second PG transistor 210 (and of the second PG transistor 240).

FIGS. 19A, 19B, 19C, and 19D are demonstrative illustrations of various cross-sectional views of SRAM device 100 during a process of manufacturing thereof, following a step illustrated in FIGS. 18A, 18B, 18C, and 18D, according to embodiments of present invention. More specifically, embodiments of present invention provide forming a local interconnect (LI) 641 connecting the CA contact 621, the CA contact 622, and the CB contact 626; forming a LI 642 connecting the CA contact 624 and the CA contact 625; and forming a LI 643 connected to the CB contact 627. After forming the above CA/CB contacts, local interconnects, bit line, word line, and the power supply line, embodiments of present invention provide forming a plurality of back-of-the-line (BEOL) layers 803 at the backside of the SRAM device 100.

Embodiments of present invention further provide forming a second bit line 721 connected to the CA contact 623 through a deep via (type-A); forming a VSS power supply line 722 connected to the CA contact 624 through a deep via (type-A) or connected to the LI 642 through a short via (type-B); and forming a second word line 723 connected to the LI 643, which connects to the CB contact 627, through a short via (type-B).

Here, it is to be noted that the first and second internal contacts 610 and 620, the CA contacts (611-614 and 621-625), the CB contacts (615-616 and 626-627), the local interconnects (631-633 and 641-643), the first bit lines (711 and 714), the second bit lines (721 and 724), the first word line (712), the second word line (723), the VDD power supply line (713), and the VSS power supply line (722), both on the frontside and the backside of the SRAM device 100, may be made of tungsten (W), cobalt (Co), ruthenium (Ru), and/or copper (Cu). Other conductive materials may be used as well.

Figure 20B:
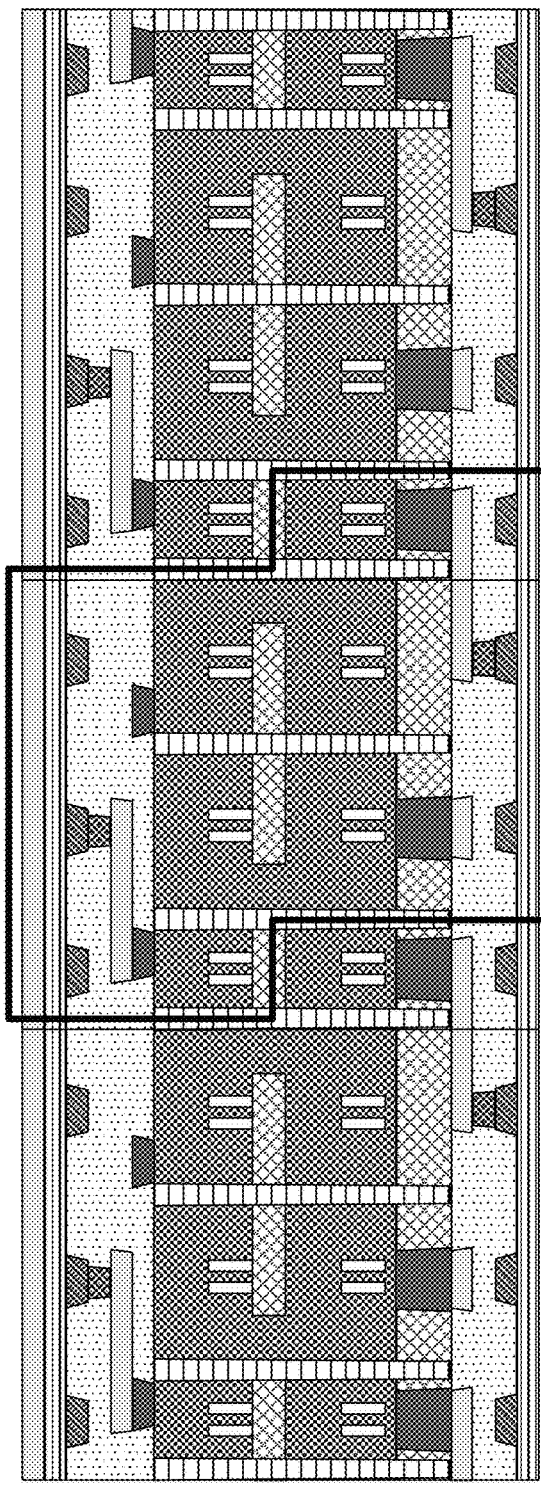
FIGS. 20A and 20B are demonstrative illustrations of two cross-sectional views of the SRAM device as schematically illustrated in FIG. 1 according to one embodiment.
Figure 20A:
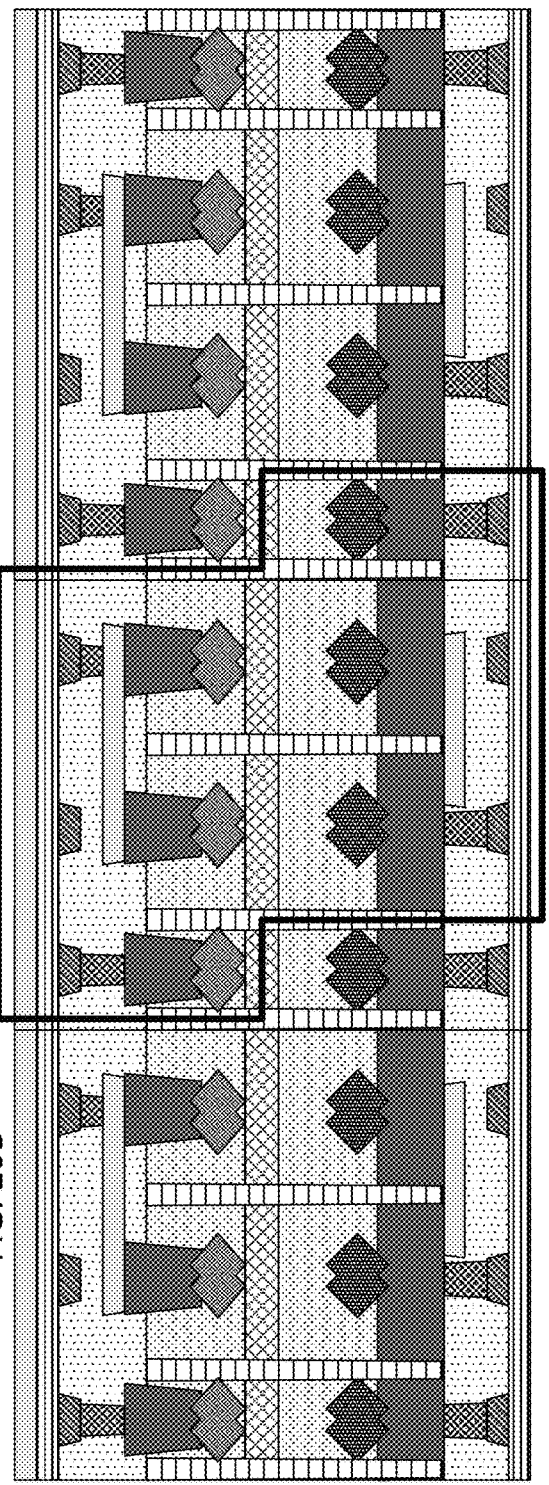

FIGS. 20A and 20B are demonstrative illustrations of two cross-sectional views of the SRAM device as schematically illustrated in FIG. 1 according to one embodiment. More specifically, FIG. 20A illustrates a cross-sectional view of the SRAM device 100 taken along the dashed line Y1, across second source/drain region (to the left of the gate), as illustrated in the top view of simplified layout in FIG. 4, and FIG. 20B illustrates a cross-sectional view of the SRAM device 100 taken along the dashed line Y2, across fins at the gate. By comparing FIGS. 20A and 20B with FIG. 1, it is clear that the solid line outlines the SRAM cell 10 with its first PG transistor stacked over a second PG transistor of a second SRAM cell (to the left of the SRAM cell 10), and its second PG transistor stacked underneath a first PG transistor of a third SRAM cell (to its right of the SRAM cell 10).

Figure 21B:
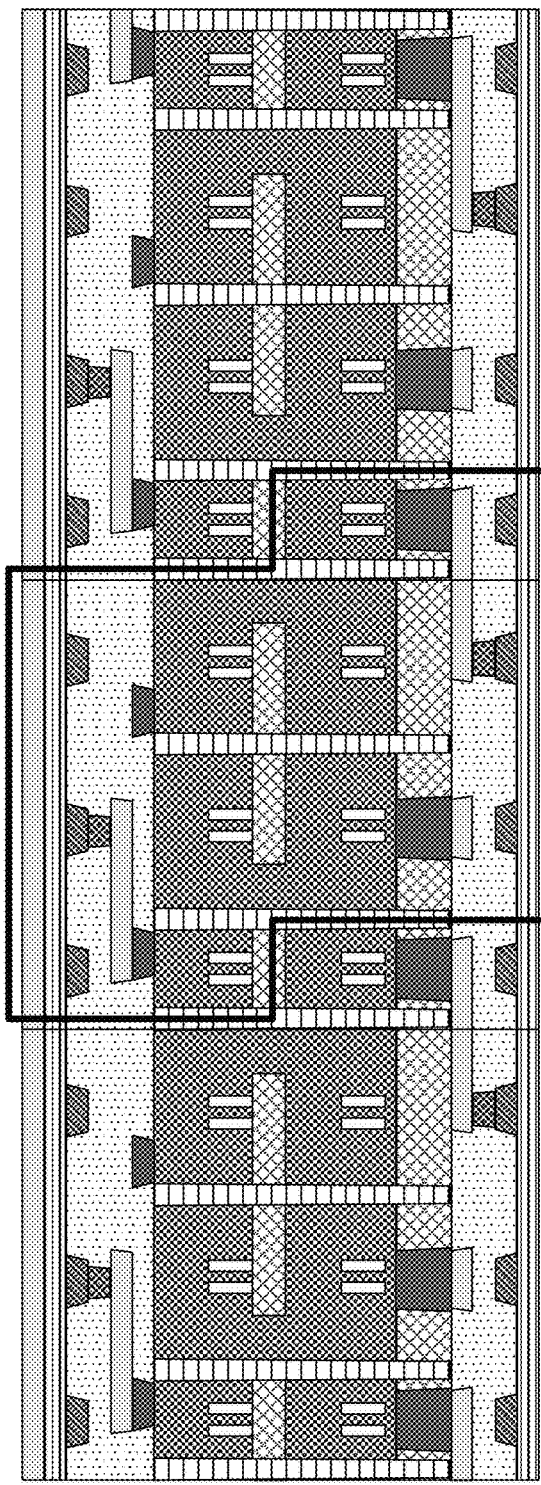
FIGS. 21A and 21B are demonstrative illustrations of two cross-sectional views of the SRAM device as schematically illustrated in FIG. 1 according to another embodiment.
Figure 21A:
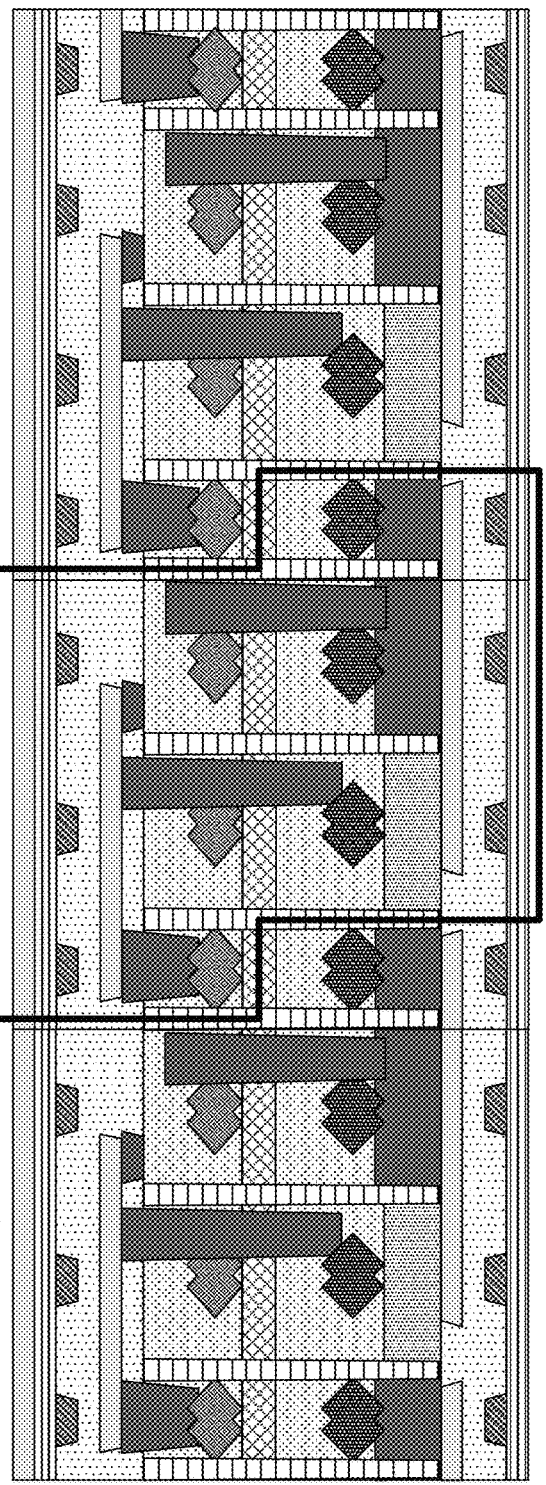

FIGS. 21A and 21B are demonstrative illustrations of two cross-sectional views of the SRAM device as schematically illustrated in FIG. 1 according to another embodiment. Similar to FIG. 20A, FIG. 21A illustrates a cross-sectional view of the SRAM device 100 taken along the dashed line Y3, across first source/drain region (to the right of the gate), as illustrated in the top view of simplified layout in FIG. 4, and FIG. 21B illustrates the same cross-sectional view of the SRAM device 100 taken along the dashed line Y2, across fins at the gate, as FIG. 20B. A corresponding SRAM cell 10 is outlined by the solid line.

Figure 22:
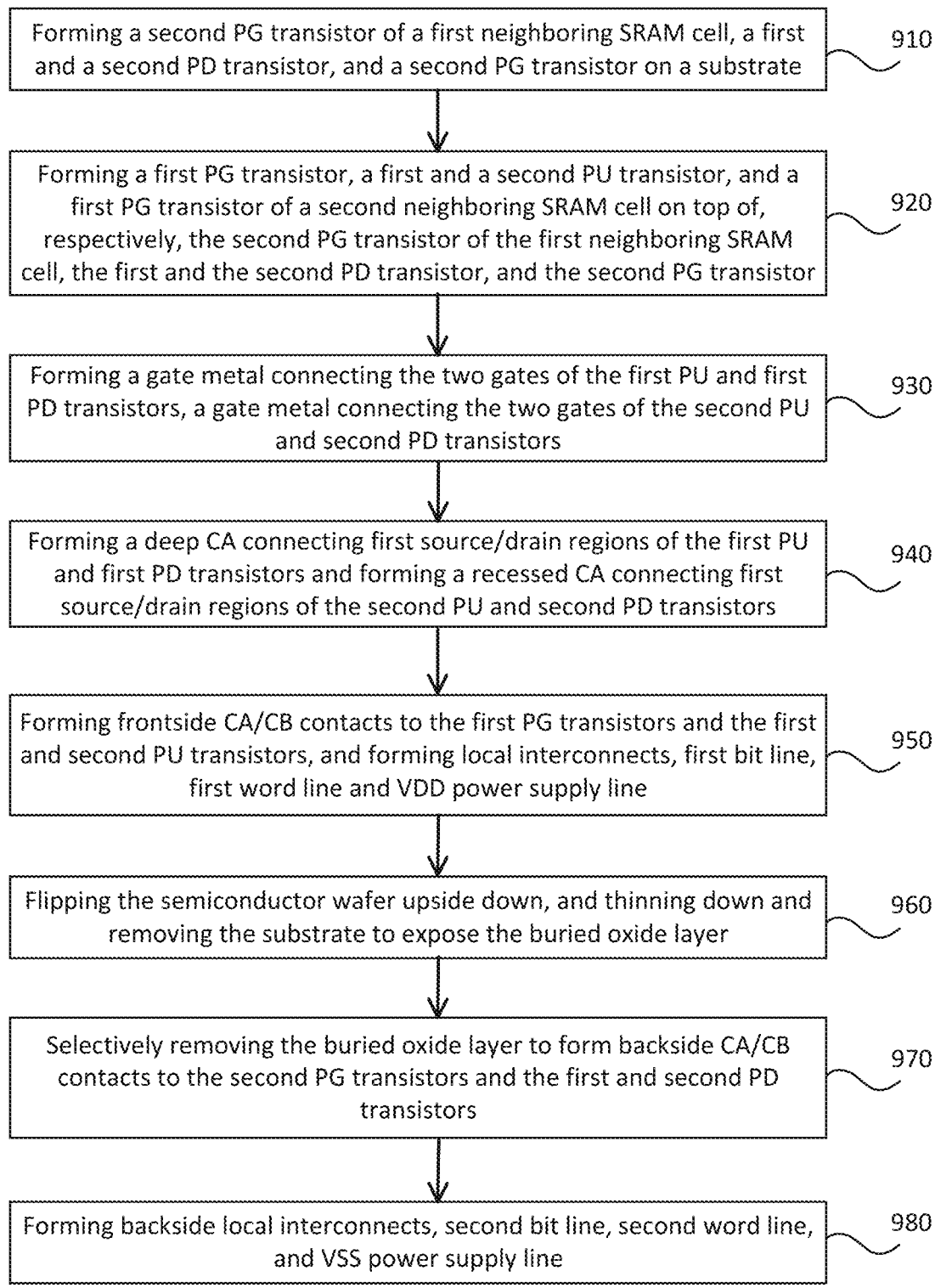
FIG. 22 is a demonstrative illustration of a flow-chart of a method of manufacturing a SRAM device according to embodiments of present invention.

FIG. 22 is a demonstrative illustration of a flow-chart of a method of manufacturing a SRAM device according to embodiments of present invention. More specifically, embodiments of present invention provide (910) forming a second PG transistor of a first neighboring SRAM cell, a first PD transistor, a second PD transistor, and a second PG transistor on a substrate of a semiconductor wafer; (920) forming a first PG transistor, a first PU transistor, a second PU transistor, and a first PG transistor of a second neighboring SRAM cell, respectively, on top of the second PG transistor of the first neighboring SRAM cell, the first PD transistor, the second PD transistor, and the second PG transistor; (930) forming a gate metal that is common to and connects the two gates of the first PU transistor and the first PD transistor, and a gate metal that is common to and connects to the two gates of the second PU transistor and the second PD transistor; (940) forming a deep CA contact of a first internal contact, the deep CA contact connecting first source/drain regions of the first PU transistor and the first PD transistor, and forming a recessed CA contact of a second internal contact, the recessed CA contact connecting first source/drain regions of the second PU transistor and the second PD transistor; (950) forming frontside CA and CB contacts to the first PG transistors and the first and second PU transistors, and local interconnects and a first bit line, a first word line, and a VDD power supply line on top thereof; (960) flipping the semiconductor wafer upside down, thinning down and remove the substrate to expose a buried oxide layer for continued processing; (970) selectively removing the buried oxide layer to form backside CA and CB contacts to the second PG transistors and the first and second PD transistors; and (980) forming backside local interconnects, a second bit line, a second word line, and a VSS power supply line underneath the second PG transistors and the first and second PD transistors.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, the practical application or technical improvement over technologies found in the marketplace, or to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. An SRAM device comprising:
at least a first and a second SRAM cell, the first and the second SRAM cell having a first and a second pass-gate (PG) transistor respectively,
wherein the second PG transistor of the second SRAM cell and the first PG transistor of the first SRAM cell are stacked in a first PG transistor cell.

2. The SRAM device of claim 1, further comprising a third SRAM cell, the third SRAM cell having a first and a second PG transistor, wherein the first PG transistor of the third SRAM cell and the second PG transistor of the first SRAM cell are stacked in a second PG transistor cell.

3. The SRAM device of claim 2, wherein the first PG transistor of the first SRAM cell is stacked on top of the second PG transistor of the second SRAM cell and the first PG transistor of the third SRAM cell is stacked on top of the second PG transistor of the first SRAM cell.

4. The SRAM device of claim 1, wherein the first SRAM cell has a first pull-up (PU) transistor and a first pull-down (PD) transistor that are stacked in a first PU/PD transistor cell and has a second PU transistor and a second PD transistor that are stacked in a second PU/PD transistor cell.

5. The SRAM device of claim 4, wherein the first SRAM cell has a first internal contact shared by a first S/D region of the first PU transistor and a first S/D region of the first PD transistor, and a second internal contact shared by a first S/D region of the second PU transistor and the first S/D region of the second PD transistor.

6. The SRAM device of claim 4, wherein a gate stack of the first PU transistor and a gate stack of the first PD transistor are connected through an opening made in an oxide bonding layer separating the first PU transistor and the first PD transistor.

7. The SRAM device of claim 1, wherein the first SRAM cell has a frontside and a backside, and wherein at least one bit line, at least one word line, and a VSS power supply line is formed on the backside of the first SRAM cell.

8. The SRAM device of claim 1, wherein a gate stack of the second PG transistor of the second SRAM cell and a gate stack of the first PG transistor of the first SRAM cell are isolated from each other by an oxide bonding layer.

9. A method of forming an SRAM device comprising:
forming a first pass-gate (PG) transistor of a first SRAM cell in a first PG transistor cell; and
forming a second PG transistor of a second SRAM cell in the first PG transistor cell, stacked together with the first PG transistor of the first SRAM cell.

10. The method of claim 9, further comprising:
forming a second PG transistor of the first SRAM cell in a second PG transistor cell; and
forming a first PG transistor of a third SRAM cell in the second PG transistor cell, stacked together with the second PG transistor of the first SRAM cell.

11. The method of claim 10, wherein the first PG transistor of the first SRAM cell is stacked on top of the second PG transistor of the second SRAM cell, and the first PG transistor of the third SRAM cell is stacked on top of the second PG transistor of the first SRAM cell.

12. The method of claim 10, wherein the first PG transistor of the first SRAM cell is underneath the second PG transistor of the second SRAM cell, and the second PG transistor of the first SRAM cell is underneath the first PG transistor of the third SRAM cell.

13. The method of claim 9, further comprising forming a first and a second pull-up (PU) transistor of the first SRAM cell, respectively, on top of a first and a second pull-down (PD) transistor of the first SRAM cell.

14. The method of claim 13, further comprising forming a first bit line, a first word line, and a VDD power supply line of the first SRAM cell at a frontside of the SRAM device, and forming a second bit line, a second word line, and a VSS power supply line of the first SRAM cell at a backside of the SRAM device.

15. The method of claim 14, further comprising forming a first internal contact between a first source/drain region of the first PU transistor and a first source/drain region of the first PD transistor, and forming a second internal contact between a first source/drain region of the second PU transistor and a first source/drain region of the second PD transistor.

16. The method of claim 15, further comprising isolating a gate stack of the second PG transistor of the second SRAM cell from a gate stack of the first PG transistor of the first SRAM cell with an oxide bonding layer.

17. The method of claim 15, further comprising forming a common gate stack shared by the first PU transistor and the first PD transistor through an opening made in an oxide bonding layer that separate the first PU transistor and the first PD transistor.

18. A SRAM device comprising:
a first, a second, and a third SRAM cell each having a first and a second pass-gate (PG) transistor, wherein the second PG transistor of the second SRAM cell and the first PG transistor of the first SRAM cell are stacked in a first PG transistor cell, and the first PG transistor of the third SRAM cell and the second PG transistor of the first SRAM cell are stacked in a second PG transistor cell.

19. The SRAM device of claim 18, wherein the first PG transistor of the first SRAM cell is stacked on top of the second PG transistor of the second SRAM cell and the first PG transistor of the third SRAM cell is stacked on top of the second PG transistor of the first SRAM cell.

20. The SRAM device of claim 18, wherein the first PG transistor of the first SRAM cell is stacked underneath the second PG transistor of the second SRAM cell and the first PG transistor of the third SRAM cell is stacked on top of the second PG transistor of the first SRAM cell.

* * * * *